United States Patent
Kawahito

(10) Patent No.: US 8,149,150 B2
(45) Date of Patent: Apr. 3, 2012

(54) CYCLIC ANALOG/DIGITAL CONVERTER

(75) Inventor: Shoji Kawahito, Hamamatsu (JP)

(73) Assignee: National University Corporation Shizuoka University (JP)

( * ) Notice: Subject to any disclaimer, the term of this patent is extended or adjusted under 35 U.S.C. 154(b) by 17 days.

(21) Appl. No.: 12/812,204

(22) PCT Filed: Jan. 8, 2009

(86) PCT No.: PCT/JP2009/050148
§ 371 (c)(1),
(2), (4) Date: Sep. 21, 2010

(87) PCT Pub. No.: WO2009/088041
PCT Pub. Date: Jul. 16, 2009

(65) Prior Publication Data
US 2011/0006935 A1    Jan. 13, 2011

(30) Foreign Application Priority Data

Jan. 9, 2008    (JP) .............................. P2008-002598

(51) Int. Cl.
*H03M 1/00*    (2006.01)
(52) U.S. Cl. ........................ 341/126; 341/155
(58) Field of Classification Search ................... 341/126, 341/155, 122, 161, 163, 118, 158, 159; 348/308
See application file for complete search history.

(56) References Cited

U.S. PATENT DOCUMENTS
7,443,333 B2 * 10/2008 Garrity et al. ................. 341/163

FOREIGN PATENT DOCUMENTS
| JP | 5-56356 | 3/1993 |
| JP | 2005-136540 | 5/2005 |
| JP | 2007-104531 | 4/2007 |

OTHER PUBLICATIONS

English translation of International Preliminary Report on Patentability issued Aug. 19, 2010 in corresponding PCT Application No. PCT/JP2009/050148.
International Search Report.

* cited by examiner

*Primary Examiner* — Joseph Lauture
(74) *Attorney, Agent, or Firm* — Ostrolenk Faber LLP

(57) ABSTRACT

A cyclic A/D converter 21 provides an amplification type noise cancellation process and cyclic A/D conversion in which a plurality of capacitors and an operational amplifier are shared without complicated processing. In the cyclic A/D converter 21, a gain stage 23 uses first to third capacitors 33, 35 and 37 and an operational amplifier circuit 39 to perform the process for noise cancellation and amplification to generate a difference signal between first and second signal levels. In the process for noise cancellation, the difference between the first signal level $V_R$ and the second signal level $V_S$ is generated. The amplification of this difference is carried out in conjunction with the process for noise cancellation. The gain stage 23 uses the first to third capacitors 33, 35 and 37 and the operational amplifier circuit 39 to perform the process for cyclic A/D conversion of the difference signal. A sub A/D converter circuit 25 receives a signal VOP from an output (e.g., a non-inverting output) 39a of the operational amplifier circuit 39.

21 Claims, 11 Drawing Sheets

Step a

Step b

Step c

Step d

Step e

Step f

Step g

Step h

Step i

CYCLIC ANALOG/DIGITAL CONVERTER

CROSS-REFERENCE TO RELATED APPLICATION

The present application is a 35 U.S.C. §371 national phase conversion of PCT/JP2009/0050148 filed Jan. 8, 2009 and claims priority of JP2008-002598 filed Jan. 9, 2008, both incorporated herein in their entirety.

TECHNICAL FIELD

The present invention relates to a cyclic analog/digital converter.

BACKGROUND ART

Patent Document 1 discloses an A/D convertor array for image sensor. The A/D converter shown in FIG. 11 of the above document is configured to perform noise cancellation of reset noise with use of capacitors (C1, C2, C3) and an inverting amplifier and to subsequently perform cyclic A/D conversion with use of the capacitors (C1, C2) and the inverting amplifier, and the capacitor (C3) is not used in the cyclic A/D conversion.

Patent Document 2 discloses an A/D converter with a noise cancellation function. In the A/D converter shown in FIG. 4 of this document, a differential input/differential output amplifier is connected via a plurality of switches to capacitors (C1, C2, C3, C4 and C5). The capacitor (C5) determines the gain of the amplifier. This A/D converter necessitates five steps for noise cancellation as shown in FIG. 6 of the present document. A reset level is stored in the capacitor (C1), and a signal level is stored in the capacitor (C2). One terminal of the capacitor (C1) and one terminal of the capacitor (C2) are connected to differential inputs, respectively, and the other terminals of the capacitors C1 and C2 are connected to each other, thereby generating a difference signal at an output of the amplifier, and this signal indicates the difference between the reset level and the signal level. Next, connections of the capacitors (C1-C4) to the amplifier are switched through a plurality of switches, for cyclic A/D conversion, and the cyclic A/D conversion of this difference signal is carried out in two steps. The cyclic A/D conversion is repeatedly carried out to obtain an A/D conversion value with reduced random noise.

Patent Document 1: Japanese Patent Application Laid-open No. 2005-136540
Patent Document 2: Japanese Patent Application Laid-open No. 2007-104655

DISCLOSURE OF THE INVENTION

Problem to be Solved by the Invention

The cyclic analog/digital converter is suitably applicable, for example, to a configuration in which an array thereof is integrated in columns of a CMOS image sensor. The cyclic analog/digital converter, however, does not have any amplification function. In order to meet a demand for low-noise readout, it is possible to integrate, in a column, a noise canceling circuit, which has amplification function, and a cyclic A/D converter which is different from the noise canceling circuit, but this configuration results in increase in circuit scale. On the other hand, Patent Document 1 shares a part of components of a single circuit to provide the following two functions: noise cancellation of signals from pixels; and cyclic A/D conversion of the signals. Patent Document 2 shares a part of components of a single circuit to provide the following two functions: amplification type noise cancellation function; and cyclic A/D conversion. The processing system in Patent Document 2, however, leads to complexity of the circuit, and also requires complicated timing and many processing steps for the noise cancellation process.

It is an object of the present invention to provide an amplification type noise-canceling processing and cyclic analog/digital converter that shares plural capacitors and an operational amplifier for the above to avoid its complicated processing.

Means for Solving the Problem

An aspect of the present invention is directed to a cyclic analog/digital converter for processing an input signal having a first signal level including a noise component and a second signal level including a signal component superimposed on the noise component (which will be referred to hereinafter as "cyclic A/D converter"). The cyclic A/D converter comprises: (a) a gain stage having first, second and third capacitors and an operational amplifier circuit, the gain stage performing a process for noise cancellation and amplification to generate a difference signal and a process for cyclic A/D conversion of the difference signal, and the difference signal indicating a difference between the first and second signal levels; (b) a sub A/D converter circuit receiving a signal from an output of the operational amplifier circuit; (c) a logic circuit connected to the sub A/D converter circuit; (d) a D/A converter circuit operable in accordance with a control signal from the logic circuit; and (e) a timing circuit for controlling operations of the process for noise cancellation and amplification and the process for cyclic A/D conversion of the gain stage.

In the process for noise cancellation, the gain stage samples either one of the first and second signal levels into each of the first and second capacitors, and, in response to reception of another of the first and second signal levels through the first and second capacitors at an input of the operational amplifier circuit to which the third capacitor is connected as a feedback capacitor, the gain stage generates the difference signal at an output of the operational amplifier circuit and stores the difference signal in each of the first and second capacitors.

In the process for cyclic A/D conversion, the gain stage receives a signal from the D/A converter circuit through the first capacitor at the input of the operational amplifier circuit to which each of the second and third capacitors are connected as a feedback capacitor, to generate an operation value at the output of the operational amplifier circuit, and samples the operation value into the first capacitor.

In this cyclic A/D converter, the gain stage uses the first, second and third capacitors and the operational amplifier circuit to perform the process for noise cancellation and amplification to generate the difference signal. The gain stage performs the amplification in conjunction with the process for noise cancellation. Furthermore, the gain stage uses the first, second and third capacitors and the operational amplifier circuit to perform the process for cyclic A/D conversion of the difference signal. The noise cancellation process and amplification are carried out using the combination of the first and second capacitors, whereas the process for cyclic A/D conversion is carried out using the combination of the second and third capacitors. In this configuration, the first, second and third capacitors and the operational amplifier circuit are shared in the process for noise cancellation and amplification and in the process for cyclic A/D conversion.

In the cyclic A/D converter according to the present invention, an amplification factor for the difference signal is defined by a ratio of a capacitance of the third capacitor and the sum of capacitances of the first and second capacitors.

In this cyclic A/D converter, the capacitances of the first capacitor and the group of the second and third capacitors are defined for the process for cyclic A/D conversion. By changing this combination into the third capacitor and the group of the first and second capacitors, it becomes feasible to perform the amplification in conjunction with process for the noise cancellation.

In the cyclic A/D converter according to the present invention, in the process for noise cancellation, the first and second capacitors are connected in parallel to each other, and the third capacitor is connected between the input and the output of the operational amplifier circuit; the gain stage resets the input and the output of the operational amplifier circuit, and receives either one of the first and second signal levels to the first and second capacitors to store a sampled charge in each of the first and second capacitors; the gain stage rearranges the sampled charge to the first to third capacitors in response to reception of another of the first and second signal levels through the first and second capacitors at the input of the operational amplifier circuit, to generate the difference signal at the output of the operational amplifier circuit; and the gain stage samples the difference signal into the first and second capacitors to store a charge according to the difference signal in each of the first and second capacitors.

In this cyclic A/D converter, capacitors used in the process for noise cancellation are composed of the first and second capacitors, and the charge according to the difference signal is stored in each of the first and second capacitors; therefore, the second capacitor can be combined with the third capacitor in the subsequent process for cyclic A/D conversion.

In the cyclic A/D converter according to the present invention, in the process for cyclic A/D conversion, the second and third capacitors are connected in parallel to each other, and the second and third capacitors are connected to the operational amplifier circuit; in response to reception of a signal from the D/A converter circuit through the first capacitor at the input of the operational amplifier circuit, the gain stage transfers a charge on the first capacitor to the second and third capacitors to rearrange the charge, to generate the operation value at the output of the operational amplifier circuit; the first capacitor receives the operation value to store a charge according to the operation value; and the process for cyclic A/D conversion is repeatedly carried out a desired number of times such that the sub A/D converter circuit provides a bit string.

In this cyclic A/D converter, the operation value is processed at a rate defined by a ratio of the sum of capacitances of the second and third capacitors, which are connected between the input and output of the operational amplifier circuit in generation of the operation value, and the capacitance of the first capacitor.

Another aspect of the present invention is a cyclic A/D converter for processing an input signal having a first signal level including a noise component and a second signal level including a signal component superimposed on the noise component. The cyclic A/D converter comprises: (a) a gain stage including an operational amplifier circuit and first, second and third capacitors, the gain stage being capable of executing a process for noise cancellation to generate a difference signal indicating a difference between the first and second signal levels, and performing a process for cyclic A/D conversion of the difference signal; (b) a sub A/D converter circuit receiving a signal from an output of the operational amplifier circuit; (c) a logic circuit connected to the sub A/D converter circuit; (d) a D/A converter circuit operable in accordance with a control signal from the logic circuit; and (e) a timing circuit for controlling operations of the process for noise cancellation and the process for cyclic A/D conversion in the gain stage. In the process for noise cancellation, the gain stage samples either one of the first and second signal levels into a first sampling capacitor, and, in response to reception of another of the first and second signal levels through the first sampling capacitor at an input of the operational amplifier circuit to which a first feedback capacitor is connected, the gain stage generates the difference signal at an output of the operational amplifier circuit and stores the difference signal in the first sampling capacitor and the first feedback capacitor. In the process for cyclic A/D conversion, the gain stage receives a signal from the D/A converter circuit through a second sampling capacitor at the input of the operational amplifier circuit to which a second feedback capacitor is connected, to generate an operation value at the output of the operational amplifier circuit, and stores the operation value in the second sampling capacitor. The process for noise cancellation includes first and second process modes which are exclusively executable. The timing circuit selects an operation in the first and second process modes of the gain stage and controls the operation of the selected process mode. A first gain of the gain stage in the first process mode is defined by a ratio of a capacitance of the third capacitor and the sum of capacitances of the first and second capacitors. A second gain of the gain stage in the second process mode is defined by a ratio of the capacitance of the third capacitor and the capacitance of the first capacitor. The gain stage comprises: first switch means for providing a connection of the first capacitor such that the second sampling capacitor is composed of the first capacitor, and for providing a connection of the second and third capacitors such that the second feedback capacitor is composed of the second and third capacitors; second switch means for providing a connection of the first and second capacitors such that the first sampling capacitor is composed of the first and second capacitors and for providing a connection of the third capacitor such that the first feedback capacitor is composed of the third capacitor; and third switch means for providing a connection of the first capacitor such that the first sampling capacitor is composed of the first capacitor, for providing a connection of the third capacitor such that the first feedback capacitor is composed of the third capacitor, and for providing a parallel connection of the second capacitor such that the second capacitor is connected in parallel to the first sampling capacitor for sampling of the difference signal.

This cyclic A/D converter is able to execute an additional process mode by a combination of the capacitors therein, in addition to the process for noise cancellation and the process for cyclic A/D conversion in the cyclic A/D converter according to the one aspect of the present invention. With the change in the combination of capacitors, the amplification factor A (>1) can be varied between the first and second process modes. The gain stage can further comprise switch means operable in response to a signal from the timing circuit.

In the cyclic A/D converter according to the present invention, a third gain of the gain stage in the third process mode is defined by a ratio of the sum of capacitances of the second and third capacitors and a capacitance of the first capacitor. The timing circuit selects an operation in the third process mode in addition to the first and second process modes of the gain stage, and the gain stage further comprises fourth switch means for providing a connection of the first capacitor such that the first sampling capacitor is composed of the first capacitor and for providing a connection of the second and third capacitors such that the first feedback capacitor is composed of the second and third capacitors.

In this cyclic A/D converter, the gain stage is able to execute the further additional process mode. In the third process mode, the amplification A (=1) is not carried out in conjunction with the process for noise cancellation. The gain stage can further comprise switch means operable in response to a signal from the timing circuit.

A cyclic A/D converter according to still another aspect of the present invention is directed to a cyclic A/D converter for processing an input signal having a first signal level including a noise component and a second signal level including a signal component superimposed on the noise component. This cyclic A/D converter comprises: (a) a gain stage including an operational amplifier circuit and first, second and third capacitors, the gain stage being capable of executing a process for noise cancellation to generate a difference signal, and performing a process for cyclic A/D conversion of the difference signal, the difference signal indicating a difference between the first and second signal levels; (b) a sub A/D converter circuit receiving a signal from an output of the operational amplifier circuit; (c) a logic circuit connected to the sub A/D converter circuit; (d) a D/A converter circuit operable in accordance with a control signal from the logic circuit; and (e) a timing circuit for controlling operations of the process for noise cancellation and the process for cyclic A/D conversion of the gain stage. In the process for noise cancellation, the gain stage samples either one of the first and second signal levels into a first sampling capacitor, and, in response to reception of another of the first and second signal levels through the first sampling capacitor at an input of the operational amplifier circuit to which a first feedback capacitor is connected, the gain stage generates the difference signal at an output of the operational amplifier circuit, and stores the difference signal in the first sampling capacitor and the first feedback capacitor. In the process for cyclic A/D conversion, the gain stage receives a signal from the D/A converter circuit through a second sampling capacitor at the input of the operational amplifier circuit to which a second feedback capacitor is connected, to generate an operation value at the output of the operational amplifier circuit, and stores the operation value in the second sampling capacitor. The process for noise cancellation includes first and third process modes which are exclusively executable. The timing circuit selects an operation in the first and third process modes of the gain stage, and controls the selected operation of the process for noise cancellation. A first gain of the gain stage in the first process mode is defined by a ratio of a capacitance of the third capacitor and the sum of capacitances of the first and second capacitors. A third gain of the gain stage in the third process mode is defined by a ratio of the sum of the capacitances of the second and third capacitors and the capacitance of the first capacitor. The gain stage comprises: first switch means for providing a connection of the first capacitor such that the second sampling capacitor is composed of the first capacitor and for providing a connection of the second and third capacitors such that the first feedback capacitor is composed of the second and third capacitors; second switch means for providing a connection of the first and second capacitors such that the first sampling capacitor is composed of the first and second capacitors and for providing a connection of the third capacitor such that the first feedback capacitor is composed of the third capacitor; and fourth switch means for providing a connection of the first capacitor such that the first sampling capacitor is composed of the first capacitor and for providing a connection of the second and third capacitors such that the first feedback capacitor is composed of the second and third capacitors.

In this A/D converter, the gain stage can further comprise switch means operable in response to a signal from the timing circuit.

In the cyclic A/D converter according to the present invention, in the process for cyclic A/D conversion, the second and third capacitors are connected in parallel to each other, and the second and third capacitors are connected to the operational amplifier circuit; in response to reception of a signal from the D/A converter circuit through the first capacitor at the input of the operational amplifier circuit, the gain stage transfers a charge on the first capacitor to the second and third capacitors for rearranging the charge, to generate the operation value at the output of the operational amplifier circuit; the first capacitor receives the operation value to store a charge according to the operation value; and the process for cyclic A/D conversion is repeatedly carried out a desired number of times such that the sub A/D converter circuit provides a bit string.

In the cyclic A/D converter according to the present invention, the sub A/D converter circuit includes a comparator for comparing a signal from the gain stage with a predetermined reference signal and providing a comparison result signal. In this cyclic A/D converter, the sub A/D converter circuit generates a digital value corresponding to the operation value from the gain stage. Furthermore, in the cyclic A/D converter according to the present invention, the sub A/D converter circuit compares a signal from the gain stage with predetermined two reference signals to generate a three-valued redundant digital signal. The cyclic A/D converter provides redundant digital codes.

In the cyclic A/D converter according to the present invention, a ratio (C2/C3) of the second capacitor and the third capacitor is represented as "m−1," where the "m" is a number of not less than two. A ratio (C1/C3) of the first capacitor and the third capacitor is represented as the "m." Furthermore, in the cyclic A/D converter according to the present invention, a gain of the cyclic A/D conversion in the gain stage is equal to two. Alternatively, in the cyclic A/D converter according to the present invention, a gain of the cyclic A/D conversion in the gain stage is less than two. The cyclic analog/digital converter further comprises a correction circuit for correcting digital values from the sub A/D converter circuit through N cyclic A/D conversion operations, using a correction factor associated with the gain, to generate digital values of the M+1 (N>M+1) bits. This cyclic A/D converter can further comprise a correction circuit for correcting N digital values from the sub A/D converter circuit to generate digital values of aforementioned M+1 (N>M+1) bits.

In the cyclic A/D converter according to the present invention, the gain stage has a fully differential configuration. The gain stage further has fourth, fifth and sixth capacitors. In the process for noise cancellation, the gain stage samples either one of the first and second signal levels into each of the fourth and fifth capacitors. The gain stage generates the difference signal at the output of the operational amplifier circuit in response to reception of another of the first and second signal levels through the fourth and fifth capacitors at an input of the operational amplifier circuit to which the sixth capacitor is connected as a feedback capacitor, and then samples the difference signal into each of the fourth and fifth capacitors. In the process for cyclic A/D conversion, the gain stage receives the signal from the D/A converter circuit through the fourth capacitor at the input of the operational amplifier circuit to which the fifth and sixth capacitors are connected as a feedback capacitor, to generate an operation value at the output of the operational amplifier circuit, and then samples the operation value into the fourth capacitor.

In this cyclic A/D converter, the gain stage of the fully differential configuration is also able to perform the process for amplification type noise cancellation and the process for cyclic A/D conversion through the simple operation and achieve reduction in noise.

Effect of the Invention

As described above, the present invention provides the amplification type noise cancellation process and cyclic A/D conversion with common use of the plural capacitors and the operational amplifier and without complicated processing.

BRIEF DESCRIPTION OF THE DRAWINGS

The forgoing object and the other objects, features, and advantages of the present invention will more readily become apparent in view of the following detailed description of the preferred embodiments of the present invention proceeding with the accompanying drawings.

LIST OF REFERENCE SYMBOLS $V_{IN}$: input signal;
$V_R$: first signal level; $V_S$: second signal level; Ri, Si, TXi: control signals; 11: vertical shift register; 12: image array; 13: pixel; 14: array of cyclic A/D converters; 15: data register; 16: horizontal shift register; 17: redundant to non-redundant representation converter circuit; 21: cyclic A/D converter; 23: gain stage; 25: sub A/D converter circuit; 27: logic circuit; 29: D/A converter circuit; 31, 31a, 31b: timing circuit; 33, 35, 37: capacitors; 39: operational amplifier circuit; 41: voltage supply.

BEST MODES FOR CARRYING OUT THE INVENTION

The teaching of the present invention can be readily understood in view of the following detailed description with reference to the accompanying drawings presented by way of illustration. Embodiments of the cyclic A/D converter according to the present invention will be described with reference to the accompanying drawings. The same portions will be denoted by the same reference symbols, if possible.

Figure 1:
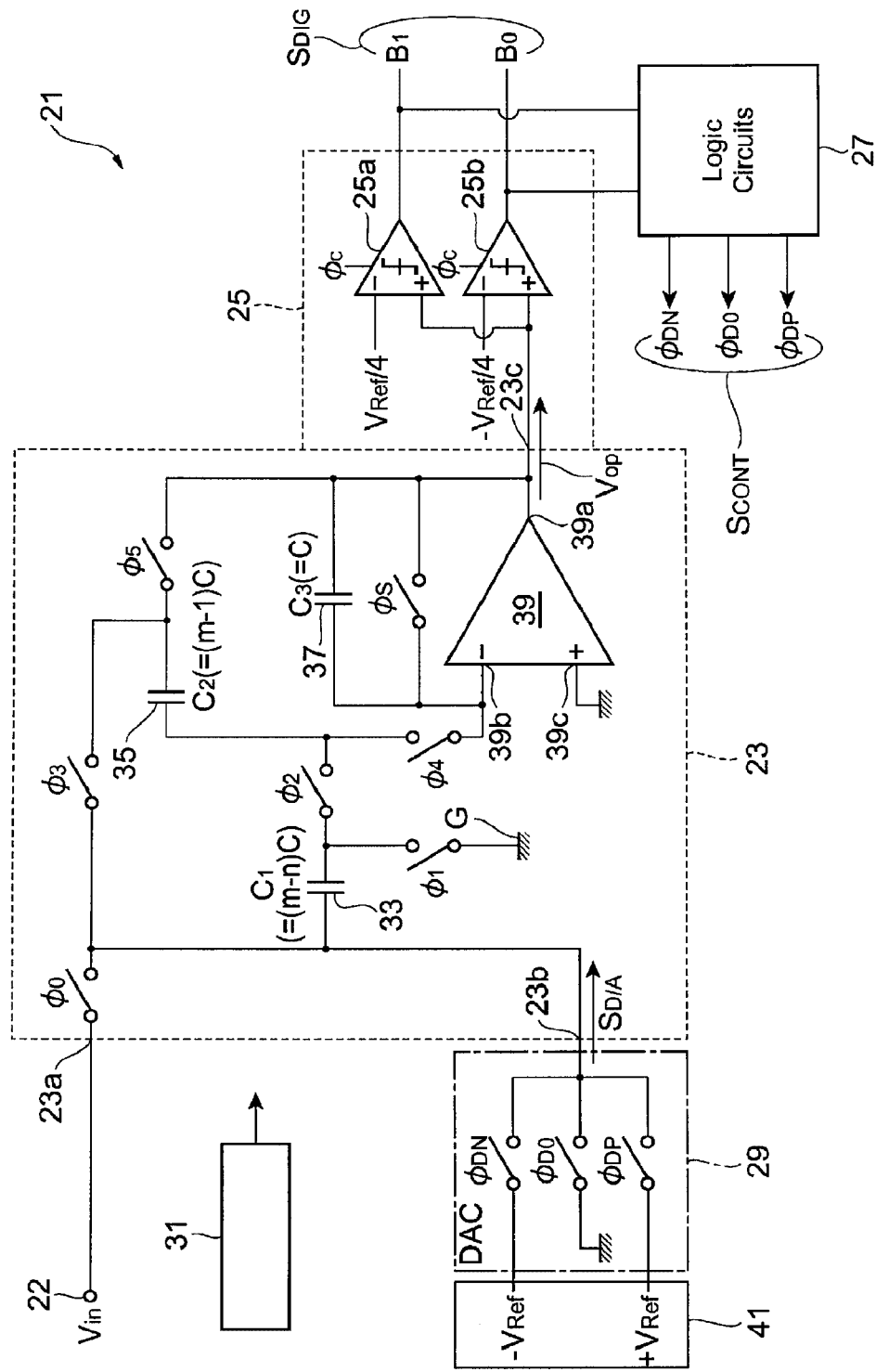
FIG. 1 is a drawing schematically showing a circuit of a cyclic A/D converter according to an embodiment of the present invention.
Figure 2:
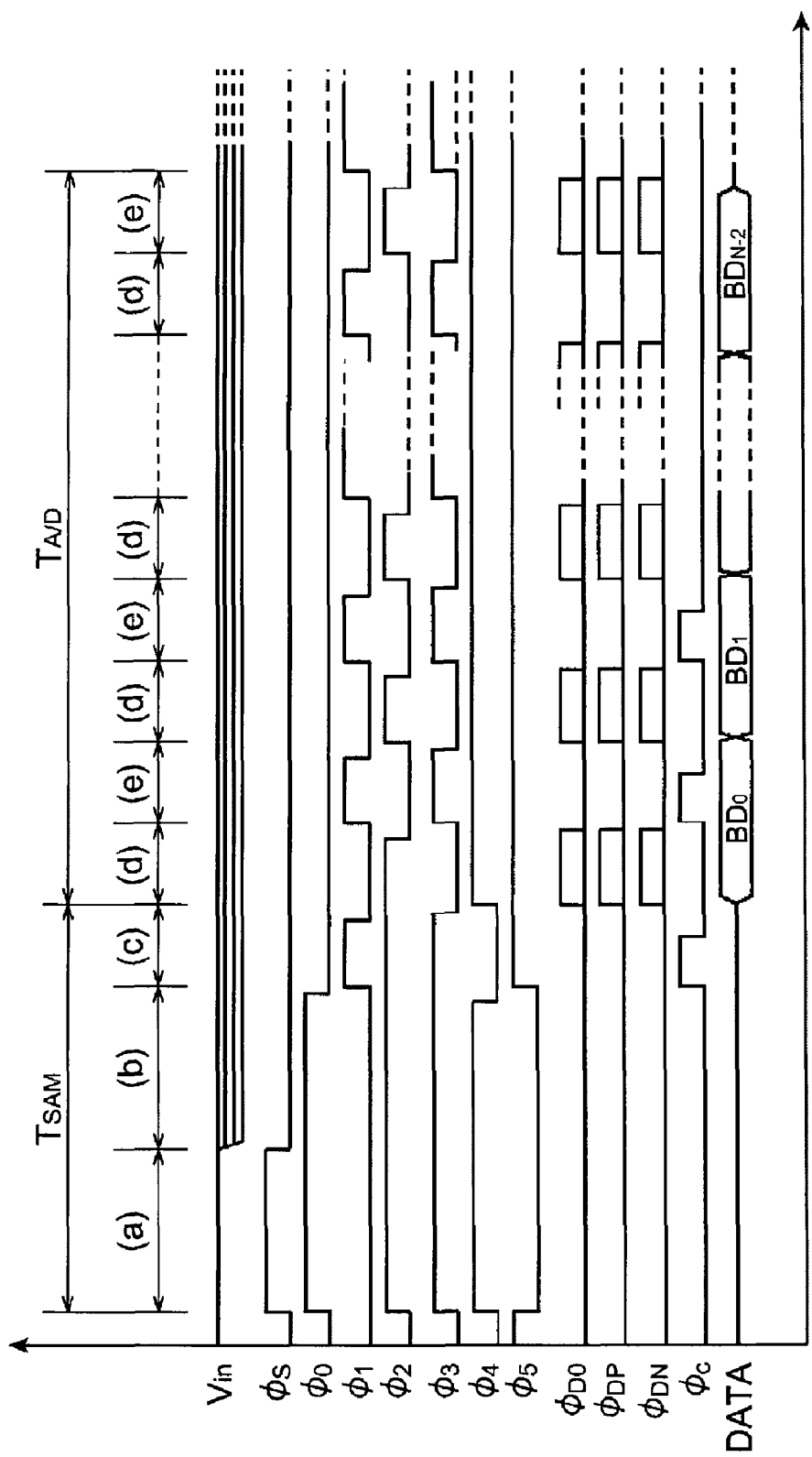
FIG. 2 is a drawing schematically showing a timing chart of the cyclic A/D converter shown in FIG. 1.
Figure 3:
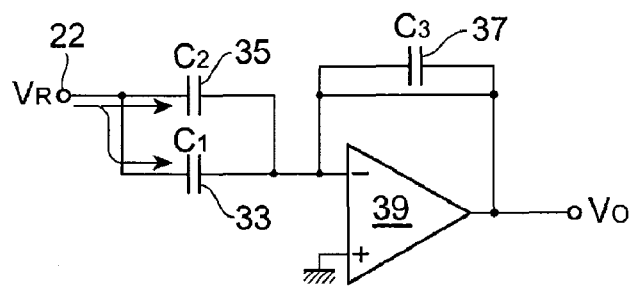
FIG. 3 is a drawing schematically showing circuit connections in major operation steps of the cyclic A/D converter shown in FIG. 1.
Figure 3:
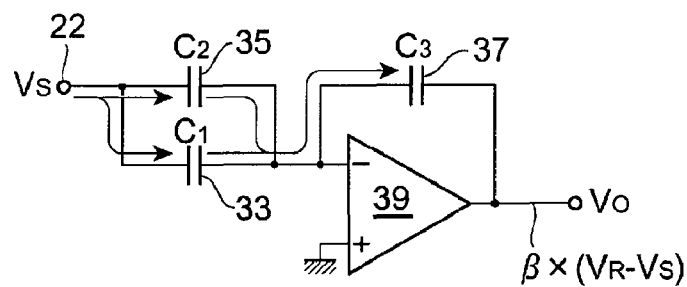
Figure 3:
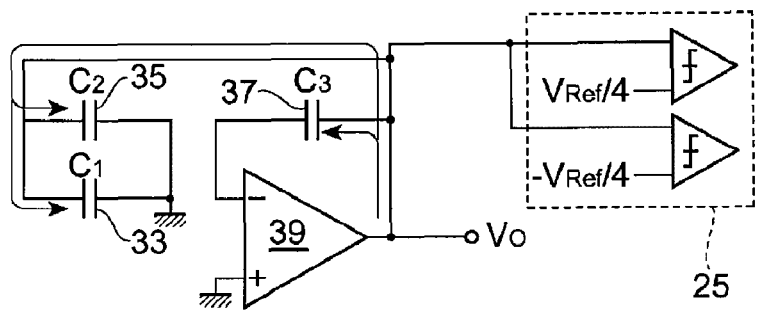
Figure 3:
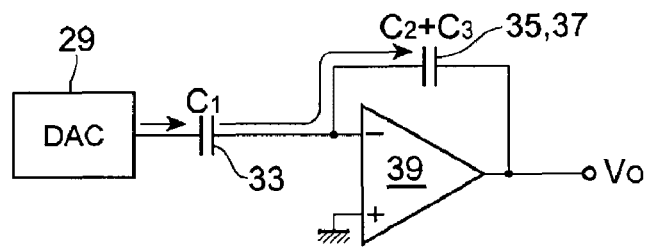
Figure 3:
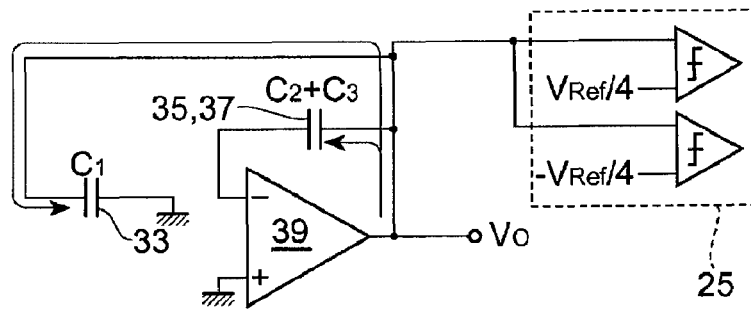

FIG. 1 is a drawing schematically showing a circuit for a cyclic A/D converter according to an embodiment of the present invention. FIG. 2 is a drawing schematically showing a timing chart for the cyclic A/D converter shown in FIG. 1. FIG. 3 is a drawing schematically showing circuit connections in major operation steps of the cyclic A/D converter shown in FIG. 1.

The cyclic A/D converter 21 processes an input signal $V_{IN}$. The input signal $V_{IN}$ has a first signal level $V_R$ including a noise component and a second signal level $V_S$ including a signal component superimposed on the noise component. The second signal level $V_S$ includes the noise component.

The cyclic A/D converter 21 comprises a gain stage 23, a sub A/D converter circuit 25, a logic circuit 27, a D/A converter circuit 29, and a timing circuit 31. The gain stage 23 has first, second and third capacitors 33, 35 and 37, and an operational amplifier circuit 39. The gain stage 23 uses the first to third capacitors 33, 35 and 37, and the operational amplifier circuit 39 to perform a process for noise cancellation and amplification to generate a difference signal indicating a difference between the first and second signal levels $V_R$ and $V_S$. In the process for noise cancellation, the difference between the first signal level $V_R$ and the second signal level $V_S$ is generated. The amplification of this difference is carried out in conjunction with the noise cancellation process and is performed as a simultaneous circuit operation. Furthermore, the gain stage 23 uses the first to third capacitors 33, 35 and 37, and the operational amplifier circuit 39 to perform a process for cyclic A/D conversion of the difference signal. The cyclic A/D conversion process is carried out in response to a signal from the gain stage 23 by the sub A/D converter circuit 25, logic circuit 27, and D/A converter circuit 29. The sub A/D converter circuit 25 receives a signal $V_{OP}$ from an output (e.g., a non-inverting output) 39a of the operational amplifier circuit 39. The sub A/D converter circuit 25 processes an operation value $V_{OP}$ provided by the gain stage 23 through the process for cyclic A/D conversion, to generate a digital signal $S_{DIG}$ according to one cycle.

In this cyclic A/D converter 21, the gain stage 23 uses the capacitors 33, 35 and 37, and the operational amplifier circuit 39 to perform the process for noise cancellation and amplification to generate the difference signal. Furthermore, the gain stage 23 uses the capacitors 33, 35 and 37, and the operational amplifier circuit 39 to perform the process for cyclic A/D conversion of the difference signal. The gain of the gain stage in the cyclic A/D conversion can be equal to 2 or less than 2. The process for noise cancellation and amplification are carried out using parallel connection of the capacitors 33 and 35, and the process for cyclic A/D conversion is carried out using parallel connection of the capacitors 35 and 37. This shows that the capacitors 33, 35 and 37, and the operational amplifier circuit 39 are shared in the process for noise cancellation and amplification and in the process for cyclic A/D conversion.

Values of the capacitors 33, 35, and 37 are determined to be, for example, the following capacitances as shown in FIG. 1:
capacitor 33: C1=(m−n)×C;
capacitor 35: C2=(m−1)×C;
capacitor 37: C3=C,
(where m>n and n≧0). In an example where n=0 and m≧2 (numeral of not less than 2), C1=C2+C3 is satisfied. At this example, the gain of the gain stage in the cyclic A/D conversion is 2. The gain of the gain stage in the cyclic A/D conversion can be, however, less than 2 as described later.

The sub A/D converter circuit 25 can include, for example, one comparator. The comparator compares an input analog signal with a predetermined reference signal, and provides a signal indicative of the comparison result. This converter circuit 25 is used to obtain a one-bit digital value. With increase in the number of comparators, the digital signal can be obtained with the number of bits over one bit. The sub A/D converter circuit 25 can include, for example, two comparators 25a and 25b. The comparators 25a and 25b compare the operation value $V_{OP}$ (which is the difference signal in the first comparison only and which will be referred to as "operation value" in the description hereinafter) with a reference signal $+V_{Ref}/4$ and $-V_{Ref}/4$, respectively, and provide comparison result signals $B_0$ and $B_1$, as shown in FIG. 1, respectively,

| Range of operation value $V_{OP}$ | Digital signal |
|---|---|
| (1) $-V_{Ref}/4 > V_{OP}$, | $-1 (B_1 = 0, B_0 = 0)$; |
| (2) $V_{Ref}/4 \geq V_{OP} \geq -V_{Ref}/4$, | $0 (B_1 = 0, B_0 = 1)$; |
| (3) $V_{OP} > +V_{Ref}/4$, | $+1 (B_1 = 1, B_0 = 1)$. |

The sub A/D converter circuit 25 compares the operation value $V_{OP}$ with the predetermined two reference signals, whereby it can generate three-valued redundant digital signals. Since this converter circuit 25 compares the input analog signal with the predetermined two reference signals, it provides a three-valued digital signal.

The logic circuit 27 is connected to the sub A/D converter circuit 25, and generates a control signal $S_{CONT}$ for controlling the D/A converter circuit 29 for cyclic A/D conversion. The D/A converter circuit 29 operates in accordance with the control signal $S_{CONT}$ to generate a D/A signal $S_{D/A}$ according to the result of the latest cyclic A/D conversion. In the present embodiment the D/A signal $S_{D/A}$ provides, for example, one of the following values in response to the control signal from the logic circuit 27:
(1) $S_{D/A}=V_{Ref}$ if the condition $(-V_{Ref}/4 > V_{OP})$ is met;
(2) $S_{D/A}=0$ if the condition $(+V_{Ref}/4 \geq V_{OP} \geq -V_{Ref}/4)$ is met;
(3) $S_{D/A}=-V_{Ref}$ if the condition $(V_{OP} > +V_{Ref}/4)$ is met.
As shown in Part (a) of FIG. 4, these three regions are assigned to digital codes D of "−1," "0" and "+1" through execution of the three-valued A/D conversion, respectively. The first code is obtained as the most significant digit. The D/A signal $S_{D/A}$ is provided to the gain stage 23 for the next cyclic A/D conversion. A voltage supply 41 supplies reference signals $+V_{Ref}$, $-V_{Ref}$, $+V_{Ref}/4$, and $-V_{Ref}/4$ to the sub A/D converter circuit 25 and the D/A converter circuit 29.

The timing circuit 31 controls the operations of the noise cancellation process & amplification and the cyclic A/D conversion of the gain stage 23. For this control, the timing circuit 31 supplies control signals and timing signals, shown in FIG. 2, to the gain stage 23 and the sub A/D converter circuit 25. The gain stage 23 can be provided with switch means ($\phi_S$, $\phi_0$ to $\phi_5$) operating in response to the signals from the timing circuit 31. The switch means provide connections of the capacitors 33, 35 and 37, and the operational amplifier circuit 39 in the process for noise cancellation. Furthermore, the switch means provide connections of the capacitors 33, 35 and 37, and the operational amplifier circuit 39 in the process for cyclic A/D conversion.

The A/D conversion process includes the noise cancellation process & amplification which is carried out in a period $T_{SAM}$ shown in FIG. 2, and the process for cyclic A/D conversion which is carried out in a period $T_{A/D}$.

In the noise cancellation process & amplification, the gain stage 23 samples one (e.g., the first signal level $V_R$) of the first and second signal levels ($V_R$ and $V_S$) into each of the capacitors 33 and 35, and receives the other (e.g., the second signal level $V_S$) of the first and second signal levels ($V_R$ and $V_S$) through the capacitors 33 and 35 at an input (e.g., inverting input) 39b of the operational amplifier circuit 39 to which the capacitor 37 is connected so as to serve as a feedback capacitor. In response to the reception of the second signal, the gain stage 23 generates a difference signal $\beta=(V_R-V_S)$ at the output 39a of the operational amplifier circuit 39, and samples this difference signal into each of the capacitors 33 and 35. The coefficient $\beta (>1)$ indicates an amplification factor. In the process for cyclic A/D conversion, the gain stage 23 receives the D/A signal $S_{D/A}$ from the D/A converter circuit 29 through the capacitor 33 at the input 39b of the operational amplifier circuit 39 to which each of the capacitors 35, 37 is connected so as to serve as a feedback capacitor, to generate the operation value $V_{OP}$ at the output 39a of the operational amplifier circuit 39, and samples the operation value $V_{OP}$ into the capacitor 33. In the present embodiment, a non-inverting input 39c of the operational amplifier circuit 39 is connected to an imaginary ground (or a grounding line).

The amplification of the difference signal, $\beta \times (V_R-V_S)$, is carried out at an amplification factor defined by a ratio of the sum of the capacitances of the capacitors 33 and 35 to the capacitance of the capacitor 37, (C1+C2)/C3. The combined capacitance of the capacitors 35 and 37 and the capacitance of the first capacitor 33 are defined for the process for cyclic A/D conversion. By changing this combination to another combination of the capacitor 37 and a group of the capacitors 33 and 35, it becomes feasible to perform the amplification in conjunction with the process for noise cancellation.

With reference to FIG. 3, periods (a), (b) and (c) are defined for the noise cancellation process & amplification, and periods (d) and (e) are defined for the process for cyclic A/D conversion. The switch means of the gain stage 23 can combine the capacitors 33 and 35 into a connection for the noise cancellation process & amplification, and combine the capacitors 35 and 37 into a connection for the process for cyclic A/D conversion.

In step (a) shown in FIG. 3, the switches $\phi_S$, $\phi_0$, and $\phi_2$ to $\phi_4$ are turned on as shown in FIG. 2, and the switches $\phi_1$ and $\phi_5$ are turned off. Clock $\phi_C$ determines the operation timing of the sub A/D converter circuit (e.g., two comparators 25a and 25b) 25. Switch means provide the following connections. A switch means 1A is provided for selectively connecting the capacitors 33 and 35 to the signal input 22 of the analog/digital converter 21 such that the capacitors 33 and 35 act as a sampling capacitor, to sample the reset level $V_R$, and for selectively connecting the two ends of the capacitor 37 to each other and connecting the input 39b and output 39a of the operational amplifier circuit 39 to each other, to reset it, and the two ends of the capacitor 37 is connected to the input 39b and output 39a of the operational amplifier circuit 39, respectively. A switch means 1B is provided for disconnecting the output 39a of the operational amplifier circuit 39 from the signal input 22 and for disconnecting the input 39b of the operational amplifier circuit 39 from the grounding line G. The capacitors 33 and 35 are connected in parallel to each other, and one ends of the capacitors 33 and 35 are imaginarily grounded by operation of the operational amplifier circuit 39. The gain stage 23 connects the input 39b and output 39a of the operational amplifier circuit 39 to reset a charge on the capacitor 37, and samples the reset signal $V_R$ through the input 22 of the cyclic A/D converter 21 to store a sampling charge in each of the capacitors 33 and 35.

In step (b) shown in FIG. 3, as shown in FIG. 2, the switches $\phi_0$ and $\phi_2$ to $\phi_4$ are turned on and the switches $\phi_S$, $\phi_1$ and $\phi_5$ are turned off. A switch means 2A is provided for selectively connecting the capacitors 33 and 35 between the signal input 22 and the input 39b of the operational amplifier circuit 39 to sample the signal level $V_S$, and for selectively connecting the capacitor 37 between the input 39b and the output 39a of the operational amplifier circuit 39 such that the capacitor 37 act as a feedback capacitor. A switch means 2B is provided for selectively disconnecting the input 39b and the output 39a from each other for release of the reset of the operational amplifier circuit 39 (which will also apply to the steps hereinafter), for disconnecting the output 39a of the operational amplifier circuit 39 from the signal input 22, and for disconnecting the input 39b of the operational amplifier circuit 39 from the grounding line G. In response to reception of the signal level $V_S$ at the input 39b of the operational amplifier circuit 39 through the capacitors 33 and 35, the gain stage 23 rearranges the sampling charge to the capacitors 33 and 35, 37 to generate the difference signal at the output 39a of the operational amplifier circuit 39.

In step (c) shown in FIG. 3, as shown in FIG. 2, the switches $\phi_1$ to $\phi_3$ and $\phi_5$ are turned on and the switches $\phi_S$, $\phi_0$ and $\phi_4$ are turned off. A switch means 3A is provided for selectively connecting the capacitors 33 and 35 between the grounding line G and the output 39a of the operational amplifier circuit 39 and for selectively connecting the capacitor 37 between the input 39b and the output 39a of the operational amplifier circuit 39, to sample the difference signal. A switch means 3B is provided for disconnecting the signal input 22 from the input 23a of the gain stage 23 and for disconnecting the capacitors 33 and 35 from the input 39b of the operational amplifier circuit 39. The capacitors 33 and 35 are grounded by use of the switches $\phi_1$ and $\phi_2$, and the difference signal generated at the output 39a of the operational amplifier circuit 39 is sampled into the capacitors 33 and 35 through the switches $\phi_3$ and $\phi_5$, whereby a charge associated with the difference signal is stored in each of the capacitors 33 and 35. This difference signal is supplied through the output 23c to the sub A/D converter circuit 25 which operates in response to the signal $\phi_C$.

In step (d) shown in FIG. 3, as shown in FIG. 2, the switches $\phi_2$, $\phi_4$ and $\phi_5$ are turned on and the switches ($\phi_S$, $\phi_0$, $\phi_1$ and $\phi_3$ are turned off. For generation of the operation value $V_{OP}$, a switch means 4A is provided for selectively connecting the capacitor 33 between the input 39b of the operational amplifier circuit 39 and the D/A converter circuit 29 and for selectively connecting the capacitors 35 and 37 between the input 39b and the output 39a of the operational amplifier circuit 39 such that the capacitors 35 and 37 act as a feedback capacitor. A switch means 4B is provided for disconnecting the signal input 22 from the input 23a of the gain stage 23 and for disconnecting the capacitor 33 from the capacitor 35. The gain stage 23 receives the signal from the D/A converter circuit 29 through the capacitor 33 at the input 39a of the operational amplifier circuit 39 and in response thereto, it transfers the charge on the capacitor 33 to the capacitors 35 and 37 to rearrange the charge, thereby generating the operation value $V_{OP}$ at the output 39b of the operational amplifier circuit 39. The operation value $V_{OP}$ is processed at a rate defined by a ratio of the sum of the capacitances of the capacitors 35 and 37, which are connected between the input 39b and output 39a of the operational amplifier circuit 39, and the capacitance of the capacitor 33.

In step (e) shown in FIG. 3, as shown in FIG. 2, the switches $\phi_1$ and $\phi_3$ to $\phi_5$ are turned on and the switches $\phi_S$, $\phi_0$ and $\phi_2$ are turned off. A switch means 5A is provided for selectively connecting the capacitor 33 between the grounding line G and the output 39a of the operational amplifier circuit 39 such that the capacitor 33 acts as a sampling capacitor, to store the operation value $V_{OP}$, and for selectively connecting the capacitors 35 and 37 between the input 39b and output 39a of the operational amplifier circuit 39 such that the capacitors 35 and 37 act as a feedback capacitor. A switch means 5B is provided for disconnecting the capacitor 33 from the input 39b of the operational amplifier circuit 39, for disconnecting the capacitor 33 from the capacitor 35, and for disconnecting the capacitors 33 and 35 from the signal input 22. By sampling the operation value $V_{OP}$ into the capacitor 33, the capacitor 33 stores a charge corresponding to the operation value $V_{OP}$. In the subsequent cyclic A/D conversion in which the sub A/D converter circuit 25 provides a bit string ($BD_0$, $BD_1$, $BD_{N-2}$) by a step of repeatedly carrying out the steps (d) and (e) of the process for cyclic A/D conversion a desired number of times, as shown in FIG. 2, charges on the capacitors 33, 35 and 37 are rearranged in response to the D/A signal $S_{D/A}$ controlled by the signal from the sub A/D converter circuit 25.

As described above, the cyclic A/D converter 21 is configured to compose the sampling capacitor, which is used in the noise cancellation process, of the capacitors 33 and 35; to compose the feedback capacitor of the capacitor 37; and to store the charge according to the difference signal in each of the capacitors 33 and 35, and accordingly the capacitor 35 can be combined with the capacitor 37 in the process for subsequent cyclic A/D conversion. In the process for cyclic A/D conversion, the sampling capacitor is composed of the capacitor 33, and the capacitors 35 and 37 are connected in parallel to each other, while the capacitors 35 and 37 are connected to the operational amplifier circuit 39 such that the capacitors 35 and 37 act as a feedback capacitor. The above connections do not waste in utilization of the capacitors in the gain stage 23. Furthermore, the switch $\phi5$ is connected between the capacitor 35 and the output 39a of the operational amplifier circuit 39. By turning the switch $\phi5$ off, the capacitor 35 is disconnected from the output 39a of the operational amplifier circuit 39 in the process for noise cancellation and amplification. The switch $\phi_3$ is connected between the capacitor 35 and the capacitor 33. By turning the switch $\phi3$ off, the capacitor 35 is disconnected from the capacitor 33 in the process for noise cancellation and amplification. The switches $\phi_2$ and $\phi_3$ enable the parallel connection of the capacitors 33 and 35. By turning the switches $\phi_4$ and $\phi_5$ on, the capacitor 35 is connected between the input 39b and the output 39a of the operational amplifier circuit 39, thereby enabling the parallel connection of the capacitors 35 and 37.

Assuming n=0 for simplicity, the cyclic A/D converter 21 is so configured that the ratio (C2/C3) of the capacitor 35 and the capacitor 37 is "m−1" and that the ratio (C1/C3) of the capacitor 33 and the capacitor 37 is "m." This "m" is a real number of not less than 2. The gain stage 23 performs the process for cyclic A/D conversion based on capacitance ratio (C1+C2+C3)/(C2+C3). The amplification in the noise cancellation is defined by ratio (C1+C2)/C3 of the sum of the capacitances of the capacitors 33 and 35 to the capacitance of the capacitor 37.

Figure 4A:
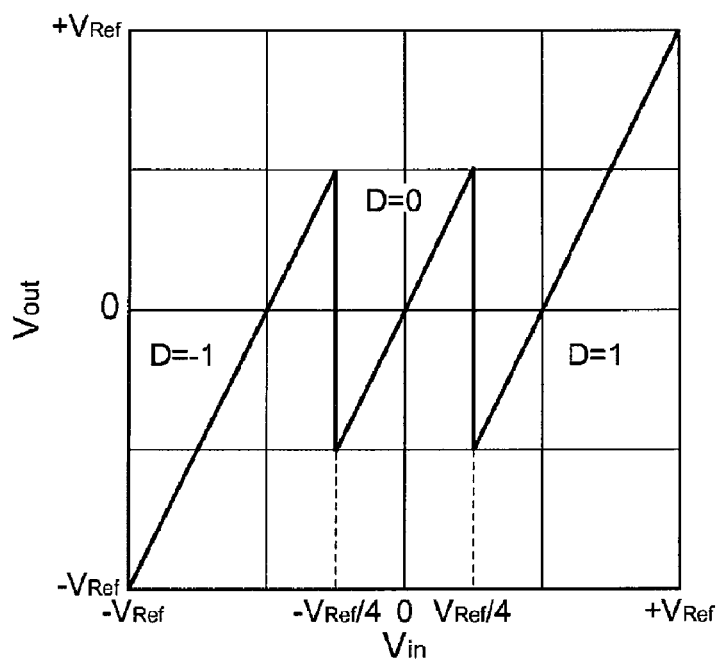
FIG. 4a illustrates digital codes used in the cyclic A/D converter shown in FIG. 1.
Figure 4B:
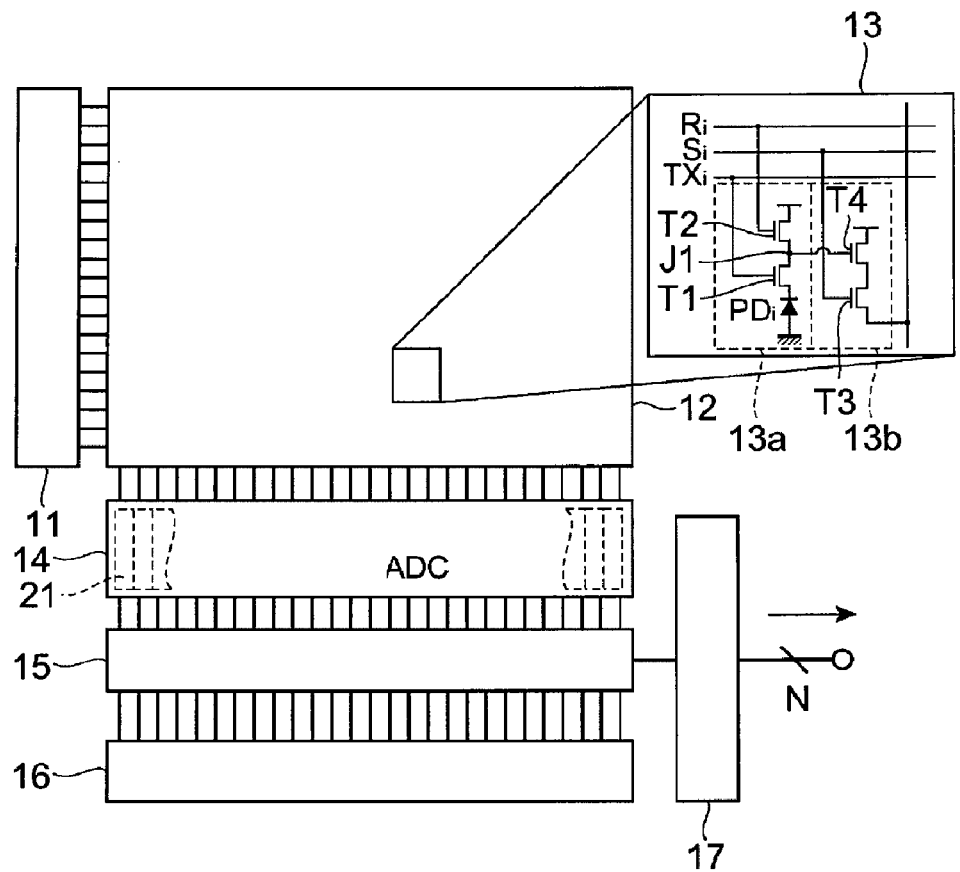
FIG. 4b is a drawing schematically showing a CMOS image sensor circuit according to an embodiment of the present invention.

Part (b) of FIG. 4 is a drawing schematically showing circuit blocks of a CMOS image sensor circuit in which the A/D converters shown in FIG. 1 is incorporated. A vertical shift register 11 supplies control signals Ri, Si, and TXi given to pixels 13 which constitutes an image array 12, and transmits signals, which is associated with photo-charges acquired by the respective pixels 13, to an array 14 of cyclic A/D converters 21. The array 14 of cyclic A/D converters 21 includes the plurality of basic circuits shown in FIG. 1 and is able to process the signals from the respective pixels 13 in parallel. The A/D conversion result per cycle in the cyclic A/D conversion is stored in a data register 15, and after the A/D conversion, they are read out in response to horizontal scanning in accordance with a control signal from a horizontal shift register 16. Each digital value read takes one of three values; that is, the digital value has a redundant representation. Each digital value read out by the horizontal scanning of the digital signals is converted into a binary number of a non-redundant representation by redundant to non-redundant representation converter circuit 17.

With reference to FIG. 4, the cyclic A/D converter 21 is used in the image sensor circuit including pixels arranged in an array. Each pixel 13 includes a sensor circuit 13a, which has a photodiode PDi, and an amplifier circuit 13b for amplifying a sensor signal from the sensor circuit 13a. The pixel 13 receives a reset signal to initialize an internal state thereof. After this initialization, the pixel 13 provides an electric signal corresponding to light that the photodiode PDi receives. The electric signal contains a significant signal component, and also contains a noise component such as reset noise. Each pixel 13 is provided with MOS transistors T1 to T4 and the photodiode PDi for conversion of light into charge. The transistor T1 to respond to the control signal TXi controls transfer of charge, the transistor T2 to respond to the control signal Ri controls initialization of charge, and the transistor T3 to respond to the control signal Si controls selection of pixel. The transistor T4 responds to a potential at a junction J1 between the transistors T1 and T2. At each pixel 13, reset noise is generated in response to the reset operation. A voltage output signal from each pixel 13 contains fixed pattern noise peculiar to each pixel. Furthermore, random noise is generated by devices and others connected to the input of A/D converter 21. The pixels 13 are arranged in a matrix form, and the signals $V_R$ and $V_S$ from the pixels 13 are transferred to the array 14 of cyclic A/D converters 21 through signal lines connected to the amplifier circuits 13b.

Figure 5:
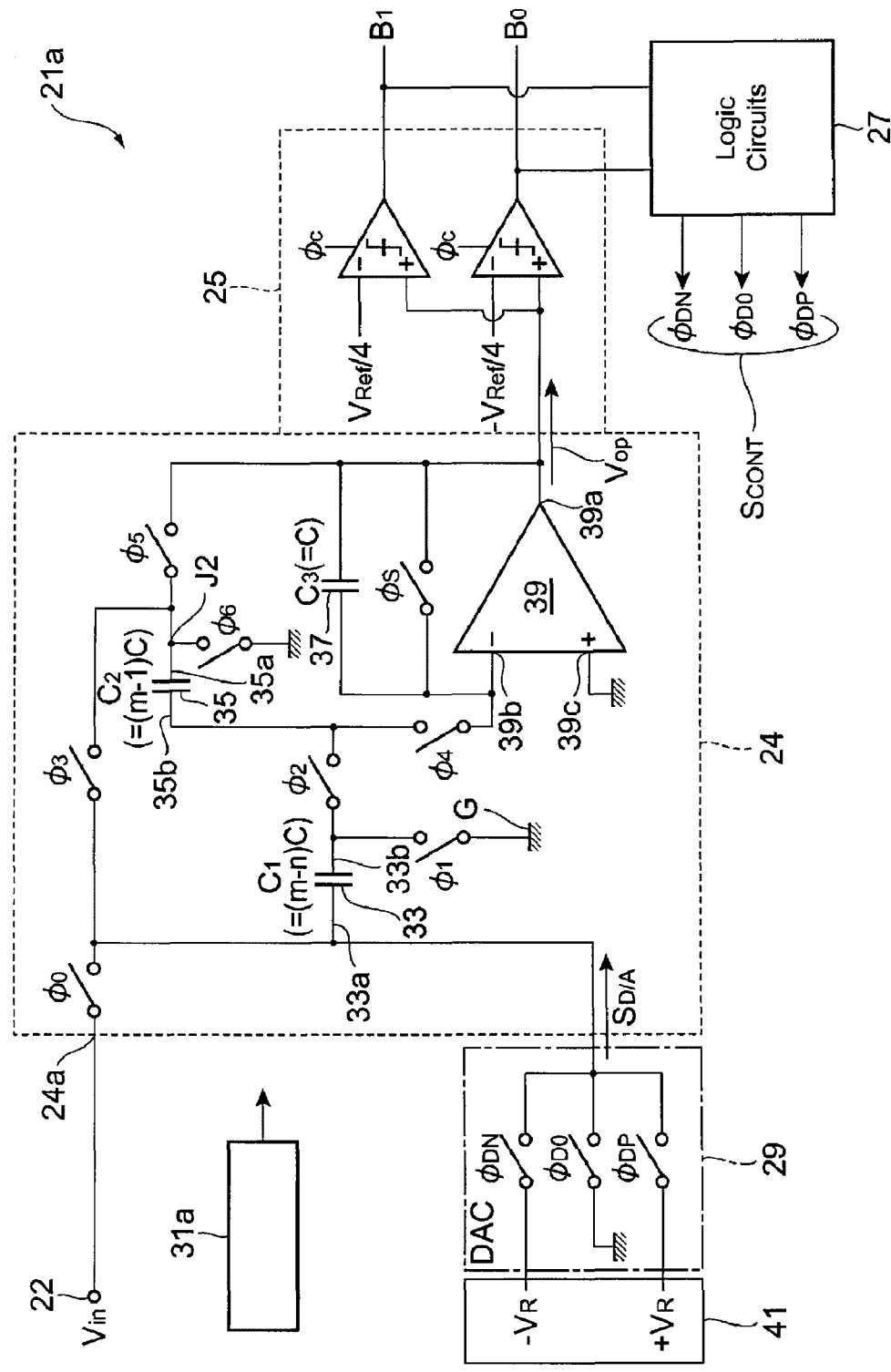
FIG. 5 is a drawing schematically showing a circuit of a modification example for the cyclic A/D converter according to the embodiment.
Figure 6:
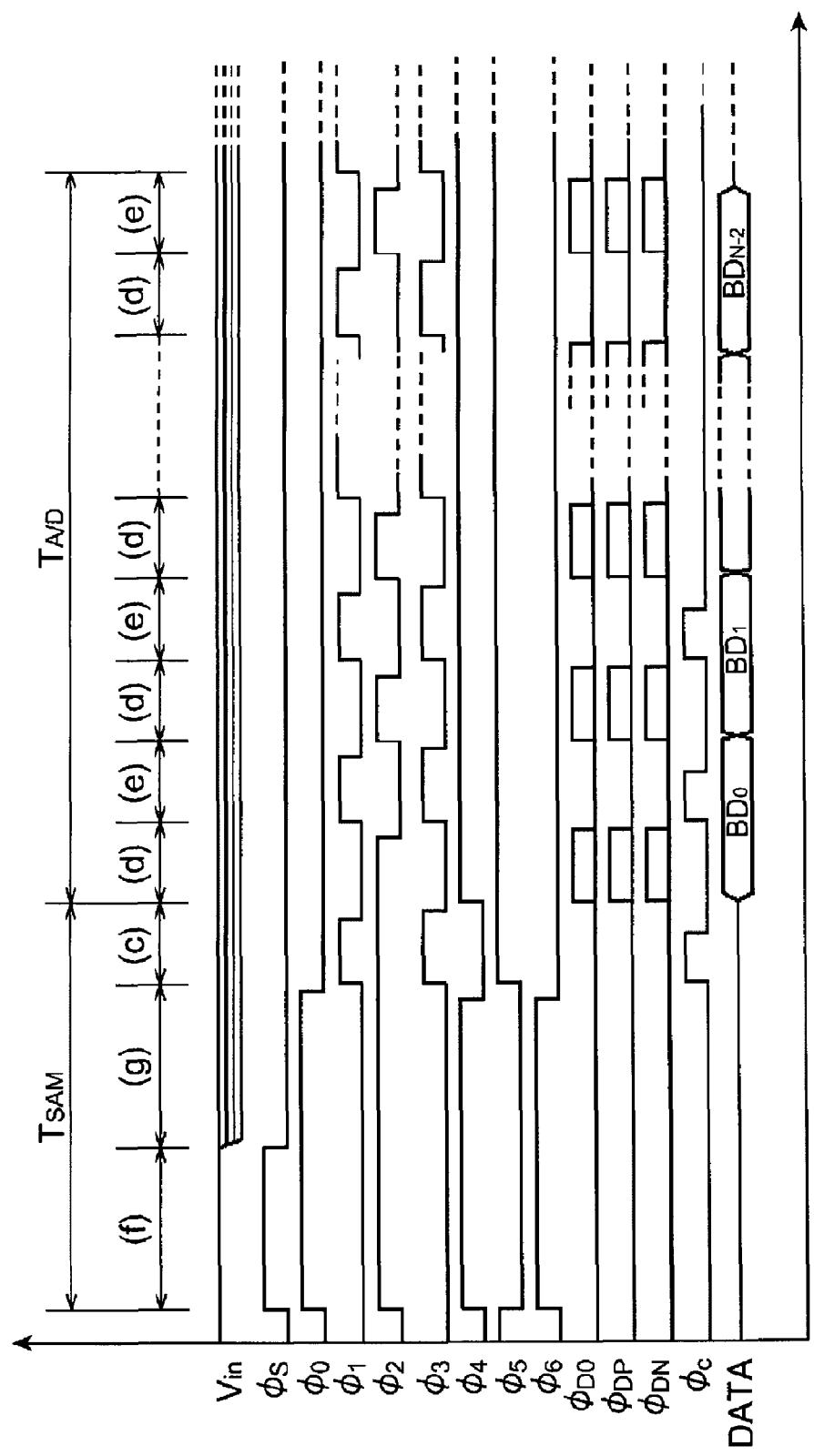
FIG. 6 is a drawing schematically showing an operation timing chart of the cyclic A/D converter shown in FIG. 5.
Figure 7:
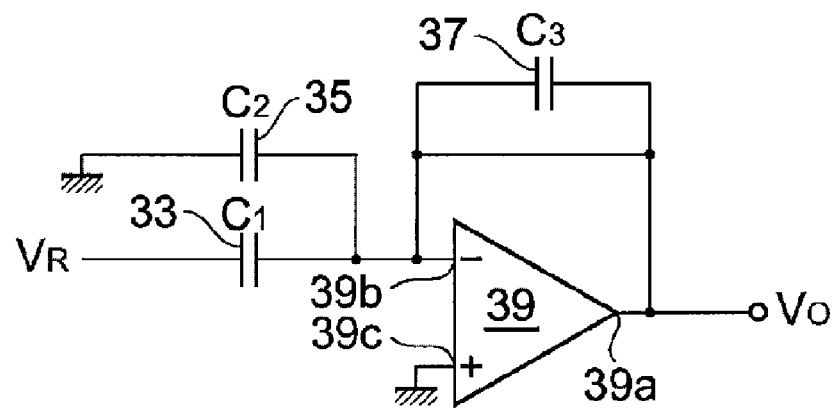
FIG. 7 is a drawing schematically showing circuit connections in major operation steps for the cyclic A/D converter shown in FIG. 5.
Figure 7:
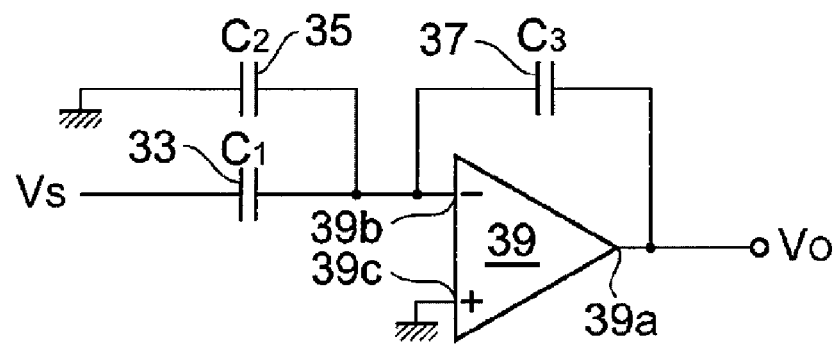
Figure 8:
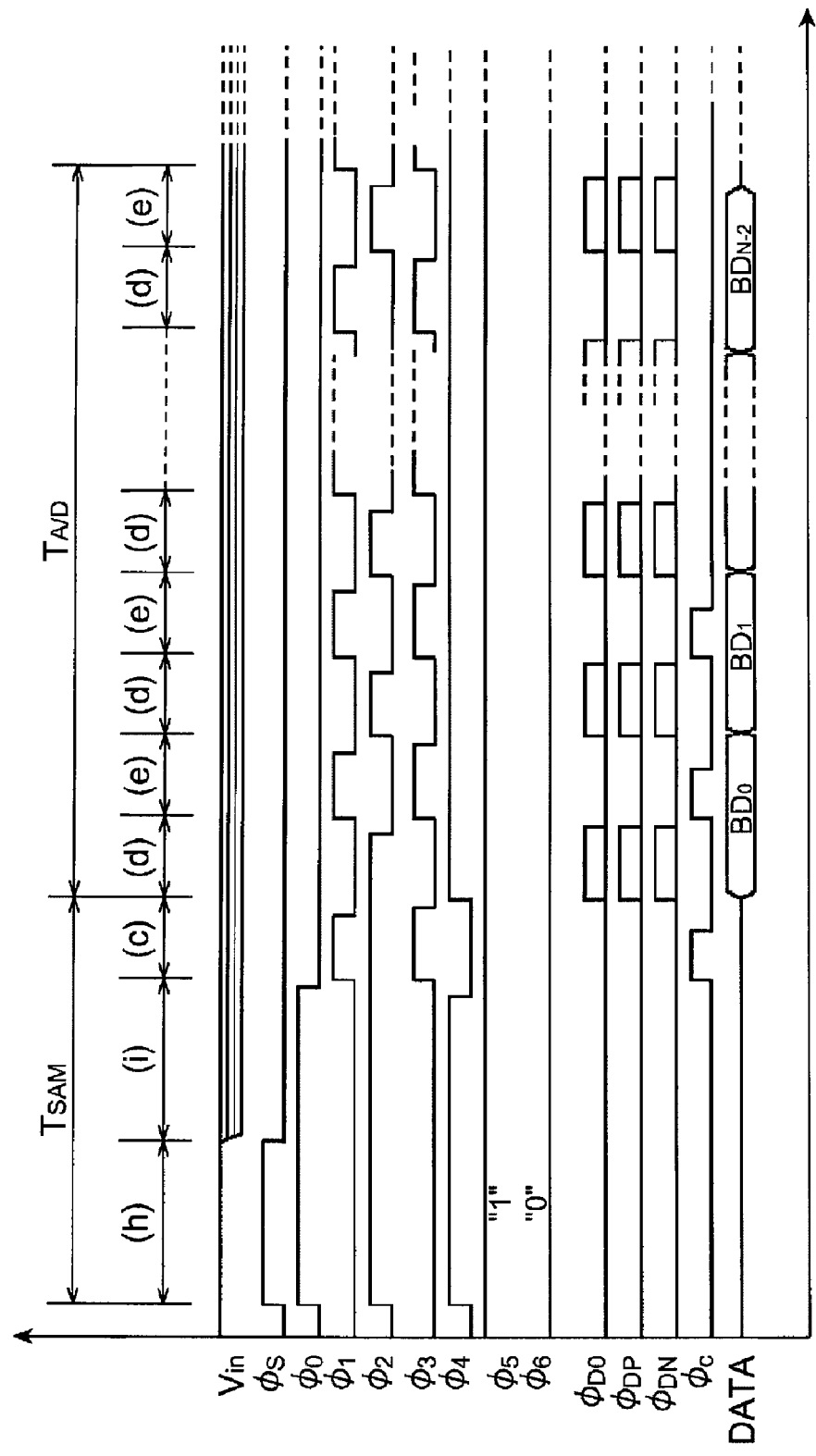
FIG. 8 is a drawing schematically showing another operation timing chart for the cyclic A/D converter shown in FIG. 5.
Figure 9:
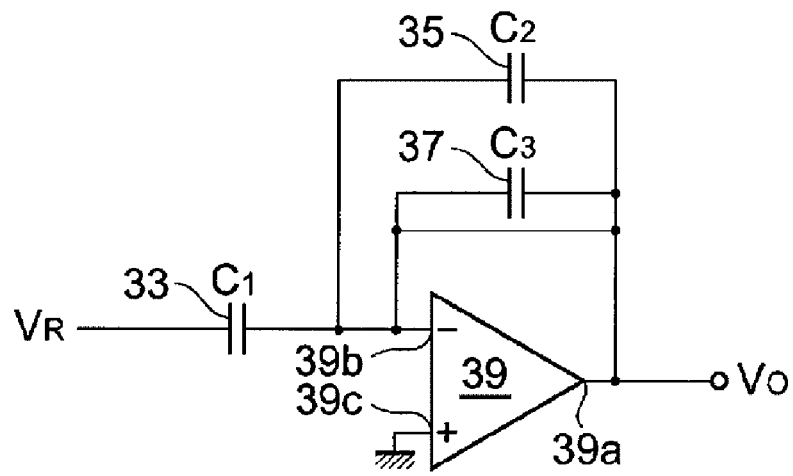
FIG. 9 is a drawing schematically showing circuit connections in major operation steps for the cyclic A/D converter shown in FIG. 8.
Figure 9:
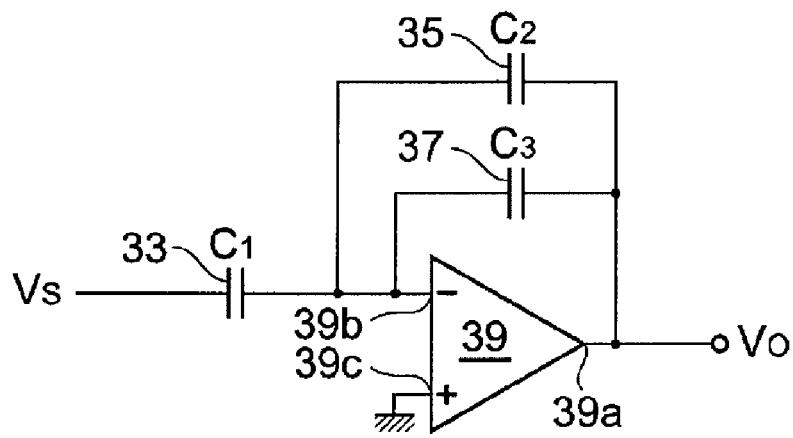

FIG. 5 is a drawing schematically showing a circuit of a modification example of the cyclic A/D converter according to the present embodiment. FIG. 6 is a drawing schematically showing an operation timing chart of the cyclic A/D converter shown in FIG. 5. FIG. 7 is a drawing schematically showing circuit connections in major operation steps of the cyclic A/D converter shown in FIG. 5. FIG. 8 is a drawing schematically showing another operation timing chart of the cyclic A/D converter shown in FIG. 5. FIG. 9 is a drawing schematically showing circuit connections in major operation steps of the cyclic A/D converter shown in FIG. 8. The cyclic A/D converter 21a can operate according to any one of the timing charts shown in FIGS. 2, 6 and 8.

The cyclic A/D converter 21a includes a gain stage 24, instead of the gain stage 23, for performing the process for cyclic A/D conversion of the difference signal. The gain stage 24 can execute the process for noise cancellation in first and second process modes in order to generate the difference signal. Furthermore, the gain stage 24 can execute the process for noise cancellation in first and third process modes in order to generate the difference signal. In addition, the gain stage 24 can execute the process for noise cancellation in the first to third process modes in order to generate the difference signal. A timing circuit 31a generates control signals for selecting an operation in the process modes in the gain stage 24 and for controlling the operation in the selected process mode of the process for noise cancellation and the operation of the cyclic A/D conversion. In the first process mode, the timing circuit 31a supplies the control signals for execution of the timing chart shown in FIG. 2 to the gain stage 24. In the second process mode, the timing circuit 31a supplies the control signals for execution of the timing chart shown in FIG. 6 to the gain stage 24. In the third process mode, the timing circuit 31a supplies the control signals for execution of the timing chart shown in FIG. 8 to the gain stage 24.

The cyclic A/D converter 21a can perform the amplification at first and second amplification factors in the first and second process modes, respectively. The first amplification factor is different from the second amplification factor. The first amplification factor is defined by a ratio of the sum of the capacitances of the capacitors 33, 35 to the capacitance of the capacitor 37, i.e., (C1+C2)/C3. The second amplification factor is defined by a ratio of the capacitance of the capacitor 33 to the capacitance of the capacitor 37, i.e., C1/C3. For example, when a gain of the gain stage 24 in the cyclic A/D conversion is two, the embodiment of this cyclic A/D converter 21a shows that the amplification factors (gain A>1) in the first and second process modes can differ from each other by change in the combination of capacitors 33, 35 and 37. In the third process mode, no amplification is carried out in conjunction with the noise cancellation process (gain A=1). For example, when the gain of the gain stage 24 in the cyclic A/D conversion is less than two, the amplification factors (gain A>1) are achieved in the first and second process modes.

The second process mode follows the timing chart shown in FIG. 6. The gain stage 24 samples, for example, the reset level $V_R$ into the capacitor 33 and, for example, in response to reception of the signal level $V_S$ through the capacitor 33 at the input 39b of the operational amplifier circuit 39 to which the capacitor 37 is connected as a feedback capacitor, it performs generation of the difference signal at the output 39a of the operational amplifier circuit 39 and its amplification. This difference signal is sampled similarly into each of the capacitors 33 and 35.

The third process mode follows the timing chart shown in FIG. 8. The gain stage 24 samples, for example, the reset level $V_R$ into the capacitor 33 and, for example, in response to reception of the signal level $V_S$ through the capacitor 33 at the input 39b of the operational amplifier circuit 39 to which the capacitors 35 and 37 are connected as a feedback capacitor, it generates the difference signal at the output 39a of the operational amplifier circuit 39. This difference signal is sampled similarly into each of the capacitors 33 and 35.

The second process mode will be described in more detail below. The gain stage 24 includes a switch $\phi_6$ which is added to the circuit of the gain stage 23. The switch $\phi_6$ is connected between the capacitor 35 (node J2) and the grounding line. With addition of the switch $\phi_6$, the operation in the noise cancellation process & amplification is modified according to the timing chart shown in FIG. 6. When the timing circuit 31a provides the control signals for the timing chart shown in FIG. 6, steps (f) and (g) are carried out, instead of the steps (a) and (b) shown in FIG. 3, in accordance with the control signals of the timing chart.

With reference to FIG. 6, the period steps (f) and (g) are defined in the noise cancellation process & amplification, and step (c) is used for sampling. The periods (d) and (e) are used for the process for cyclic A/D conversion.

In step (f) shown in FIG. 7, as shown in FIG. 6, the switches $\phi_S$, $\phi_0$, $\phi_2$, $\phi_4$ and $\phi_6$ are turned on, and the switches $\phi_1$, $\phi_3$ and $\phi_5$ are turned off. The clock $\phi_C$ determines the operation timing of the sub A/D converter circuit (e.g., two comparators 25a and 25b) 25. Switch means provide the following connections. A switch means 6A is provided for selectively connecting the capacitor 33 between the signal input 22 of the analog/digital converter 21 and the input 39b of the operational amplifier circuit 39 such that the capacitor 33 acts as a sampling capacitor, and for selectively connecting the capacitor 35 between the input 39b of the operational amplifier circuit 39 and the imaginary grounding line G, for sampling of the reset level $V_R$, and is provided for selectively connecting the both ends of the capacitor 37 to each other, and the input 39b and the output 39a of the operational amplifier circuit 39 to each other, for reset. Furthermore, a switch means 6B is provided for disconnecting the output 39a of the operational amplifier circuit 39 from the grounding line, for disconnecting the capacitor 33 from the grounding line G, and for disconnecting the signal input 22a from the grounding line. One ends of the capacitors 33 and 35 are connected to the imaginary ground by the operation of the operational amplifier circuit 39, and the other end of the capacitor 35 is connected through the switch $\phi_6$ to the grounding line. The gain stage 24 resets the charges on the capacitor 37 and on the input 39b and output 39a of the operational amplifier circuit 39, and receive the reset signal $V_R$ from the input 22 of the cyclic A/D converter 21a to store a sampling charge in the capacitor 33.

In step (g) shown in FIG. 7, as shown in FIG. 6, the switches $\phi_0$, $\phi_2$, $\phi_4$ and $\phi_6$ are turned on, and the switches $\phi_S$, $\phi_1$, $\phi_3$ and $\phi_5$ are turned off. A switch means 7A is provided for selectively connecting the capacitor 33 between the input 39b of the operational amplifier circuit 39 and the signal input 22 to sample the signal level $V_S$, and for selectively connecting the capacitor 37 between the input 39b and output 39a of the operational amplifier circuit 39 such that the capacitor 37 acts as a feedback capacitor. A switch means 7B is provided for releasing the reset of the operational amplifier circuit 39 to selectively disconnect the input 39b and the output 39a from each other, for disconnecting the capacitor 35 from the signal input 22, for disconnecting the capacitor 35 from the output 39a of the operational amplifier circuit 39, and for disconnecting the input 39b of the operational amplifier circuit 39 from the grounding line. The gain stage 24 rearranges the sampling charge to the capacitors 33 and 37 in response to reception of the signal level $V_S$ at the input 39b of the operational amplifier circuit 39 to generate the difference signal at the output 39a of the operational amplifier circuit 39. The difference signal is stored in the capacitors 33 and 35 in accordance with step (c). The cyclic A/D conversion is carried out according to steps (d) and (e), using the charges stored in the capacitors 33, 35 and 37.

Assuming n=0 for simplicity, the cyclic A/D converter 21a is so configured that the ratio (C2/C3) of the capacitor 35 and the capacitor 37 is "m−1" and that the ratio (C1/C3) of the capacitor 33 and the capacitor 37 is "m." This "m" value is a numeral of not less than two. The gain stage 24 performs the process for cyclic A/D conversion by the capacitance ratio (C1+C2+C3)/(C2+C3). The amplification in the noise cancellation is defined by the ratio C1/C3 of the capacitance of the capacitor 37 and the capacitance of the capacitor 33.

The third process mode will be described in more detail below. The operation in the process for noise cancellation is modified according to the timing chart shown in FIG. 8. When the timing circuit 31a provides the control signals for the timing chart as shown in FIG. 8, steps (h) and (i) are carried out, instead of the steps (a) and (b) shown in FIG. 3, in accordance with the control signals of the timing chart.

With reference to FIG. 8, period steps (h) and (i) are defined in the noise cancellation process, and step (c) is used for sampling. The periods (d) and (e) are used for the process for cyclic A/D conversion. Throughout all the periods, the switch $\phi_5$ is turned on and the switch $\phi 6$ is turned off.

In step (h) shown in FIG. 8, as shown in FIG. 9, the switches $\phi_S$, $\phi_0$, $\phi_2$, $\phi_4$ and $\phi_5$ are turned on, and the switches $\phi_1$, $\phi_3$ and $\phi_6$ are turned off. The clock $\phi_C$ determines the operation timing of the sub A/D converter circuit (e.g., two comparators 25a and 25b) 25. Switch means provide the following connections. A switch means 8A is provided for selectively connecting the capacitor 33 to the signal input 22 of the analog/digital converter 21a such that the capacitor 33 acts as a sampling capacitor, to sample the reset level $V_R$, and for selectively connecting the input 39b and the output 39a of the operational amplifier circuit 39 to each other, and the two ends of the capacitors 35 and 37, which are selectively connected as a feedback capacitor between the input 39b and the output 39a, to each other, to reset them. Furthermore, a switch means 8B is provided for disconnecting one end of the capacitor 33 from the grounding line G, for disconnecting the input 39b of the operational amplifier circuit 39 from the grounding line G, and for disconnecting the output 39a of the operational amplifier circuit 39 from the signal input 22. One end of the capacitor 33 is connected to the imaginary ground by the operation of the operational amplifier circuit 39. The gain stage 24 connects the input 39b and the output 39a of the operational amplifier circuit 39 to each other to reset the charges on the capacitors 35 and 37, and receives the reset level $V_R$ from the input 22 of the cyclic A/D converter 21 to store a sampling charge in the capacitor 33.

In step (i) shown in FIG. 8, as shown in FIG. 9, the switches $\phi_0$, $\phi_2$, $\phi_4$ and $\phi_5$ are turned on and the switches $\phi_S$, $\phi_1$, $\phi_3$ and $\phi_6$ are turned off. A switch means 9A is provided for selectively connecting the capacitor 33 between the input 39b of the operational amplifier circuit 39 and the signal input 22 to sample the signal level $V_S$, and for selectively connecting the capacitors 35 and 37 between the input 39b and the output 39a of the operational amplifier circuit 39 such that the capacitors 35 and 37 act as a feedback capacitor. A switch means 9B is provided for releasing the reset of the operational amplifier circuit 39 to selectively disconnect the input 39b and the output 39a from each other, for disconnecting the output 39a of the operational amplifier circuit 39 from the signal input 22, for disconnecting the capacitor 33 from the grounding line G, and for disconnecting the input 39b of the operational amplifier circuit 39 from the grounding line G. The gain stage 24 rearranges the sampling charge to the capacitors 33, 35 and 37 in response to reception of the signal level $V_S$ through the capacitor 33 at the input 39b of the operational amplifier circuit 39, to generate the difference signal at the output 39a of the operational amplifier circuit 39. The difference signal is stored in the capacitors 33 and 35 in accordance with step (c). The cyclic A/D conversion is carried out in accordance with steps (d) and (e), using the charges stored in the capacitors 33, 35 and 37.

Assuming n=0 for simplicity in the cyclic A/D converter 21a, the cyclic A/D converter 21a is so configured that the ratio (C2/C3) of the capacitor 35 and the capacitor 37 is "m−1" and that the ratio (C1/C3) of the capacitor 33 and the capacitor 37 is "m." This "m" has a positive number of not less than two. The gain in the process for noise cancellation is defined by the ratio C1/(C2+C3)=1 of the capacitance of the capacitor 33 and the sum of the capacitances of the capacitors 35 and 37.

Typical values of the gains G0, G1 and G2 of the gain stage in the first to third process modes is described below. The implementation using n=0 provides as follows: G0=C1/(C2+C3)=1; G1=(C1+C2)/C3=2m−1; and G2=C1/C3=m. For example, typical values are as follows:

| m,  | gain G0, | gain G1, | gain G2 |
|-----|----------|----------|---------|
| 2,  | 1,       | 3,       | 2;      |
| 3/2 | 1,       | 5,       | 3/2.    |

While the A/D converter has the same circuit connections, it can be used with the different gains according to applications. For this gain selection and A/D conversion, the switch $\phi_0$ is connected between the capacitor end 33a and the input 24a of the gain stage 24; the switch $\phi_1$ is connected between the capacitor end 33b and the imaginary ground G; the switch $\phi_2$ is connected between the capacitor end 33b and the capacitor end 35b; the switch $\phi_3$ is connected between the capacitor end 33a and the capacitor end 35a; the switch $\phi_4$ is connected between the capacitor ends 33b and 35b and the input 39b; the switch $\phi_5$ is connected between the capacitor end 35a and the output 39a; and the switch $\phi_6$ is connected between the capacitor end 35a and the grounding line. In addition, the switch $\phi_S$ is connected between the input 39b and the output 39a.

Figure 10:
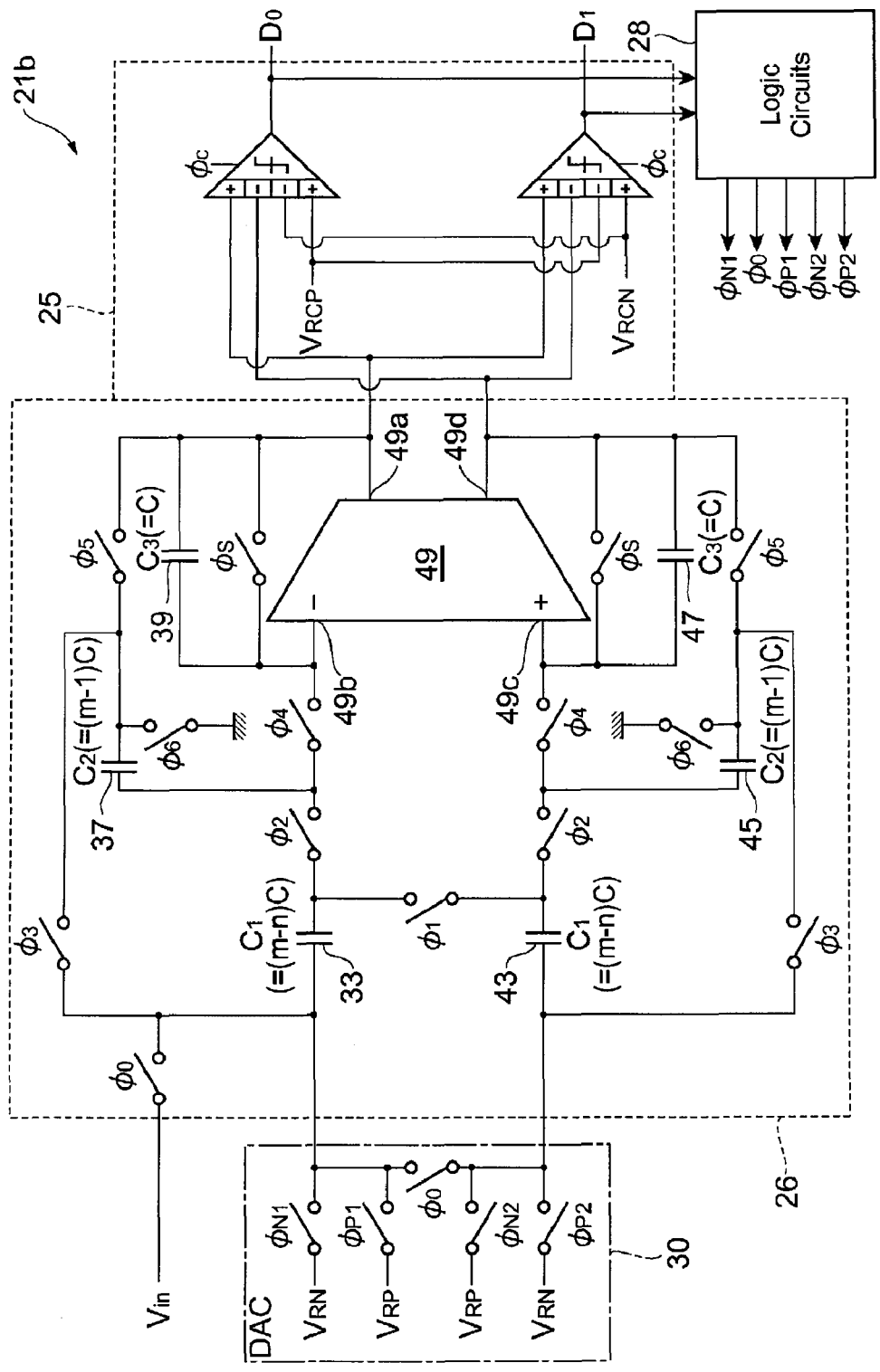
FIG. 10 is a drawing showing a circuit for a fully differential structure of a cyclic A/D converter according to an embodiment of the present invention.

FIG. 10 is a drawing showing a circuit of the cyclic A/D converter of a fully differential structure according to the present embodiment. When two switches $\phi_6$ are turned off throughout all the periods, the cyclic A/D converter 21b can operate in accordance with the timing chart shown in FIG. 2, based on the control signals provided from the timing circuit 31a, in the same manner as the circuit shown in FIG. 1. Similarly, the cyclic A/D converter 21b can operate in accordance with the timing charts shown in FIGS. 6 and 8, based on the control signals provided from the timing circuit 31a.

The cyclic A/D converter 21b includes a gain stage 26 instead of the gain stage 23, a logic circuit 28 instead of the logic circuit 27, and a D/A converter circuit 30 instead of the D/A converter circuit 29. In the cyclic A/D converter 21b, the gain stage 26 has the fully differential configuration, and the sub A/D converter circuit includes comparators of the fully differential configuration. The gain stage 26 further has fourth, fifth and sixth capacitors 43, 45 and 57. The fourth, fifth and sixth capacitors 43, 45 and 47 are connected according to complementary correspondence to the first, second and third capacitors 33, 35 and 37, respectively. In the noise cancellation process & amplification, the gain stage 26 samples, for example, the reset level $V_R$ into each of the capacitors 33 and 35 and into each of the capacitors 43 and 45 and, in response to reception of the signal level $V_S$ through the capacitors 33 and 35 and the capacitors 43 and 45 at inputs 49b and 49c of the operational amplifier circuit 49 to which the capacitors 37 and 47 are connected as feedback capacitors, the gain stage 26 generates the difference signal and a complementary signal thereto at outputs 49a and 49d of the operational amplifier circuit 49, respectively, and samples these signals into each of the capacitors 33 and 35 and into each of the capacitors 43 and 45, respectively. In the process for cyclic A/D conversion, the gain stage 26 receives signals from the D/A converter circuit 30 through the capacitors 33 and 43 at the inputs 49b and 49c of the operational amplifier circuit 49 to which each of the capacitors 35 and 37 and each of the capacitors 45 and 47 are connected as a feedback capacitor, to generate operation values $V_{OP+}$ and $V_{OP-}$ at the outputs 49a and 49d of the operational amplifier circuit 49, respectively, and samples the operation values $V_{OP+}$ and $V_{OP-}$ into the capacitors 33 and 43, respectively. In the cyclic A/D converter 21b, the gain stage 26 of the fully differential configuration is also able to execute the process for amplification type noise cancellation and the process for cyclic A/D conversion by the simple operation and to achieve reduction of noise.

Figure 11A:
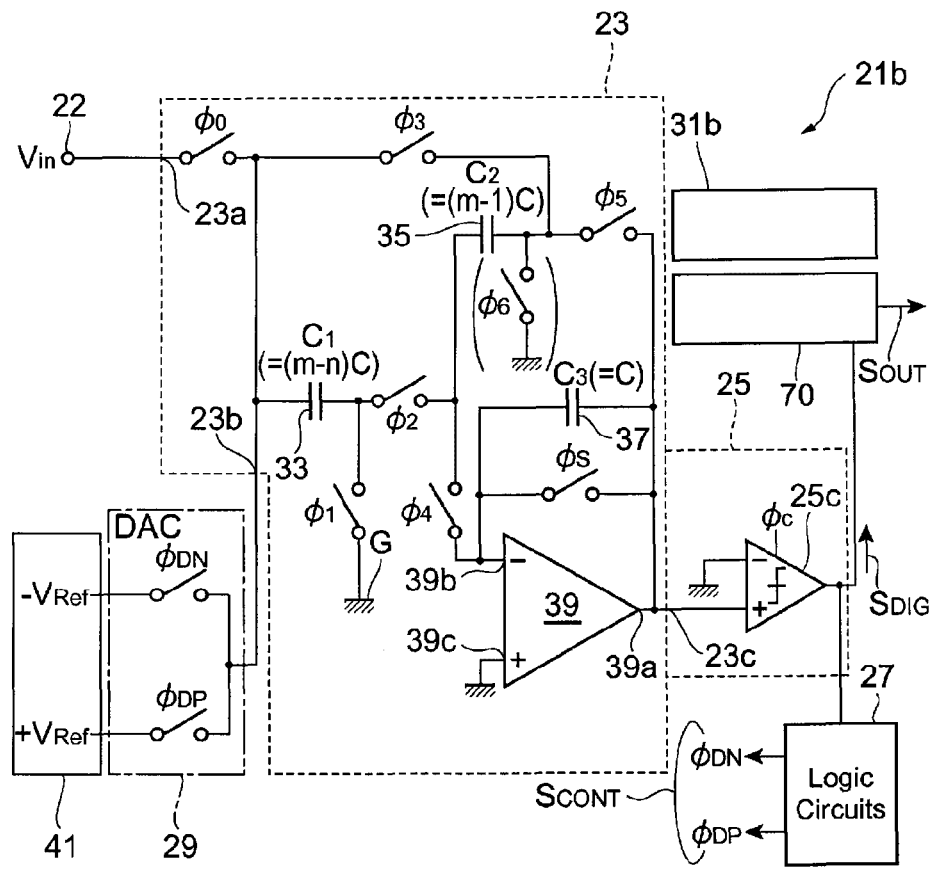
FIGS. 11a and 11b are drawings schematically showing a circuit of a cyclic A/D converter of an embodiment of the present invention, and a gain stage therein.
Figure 11B:
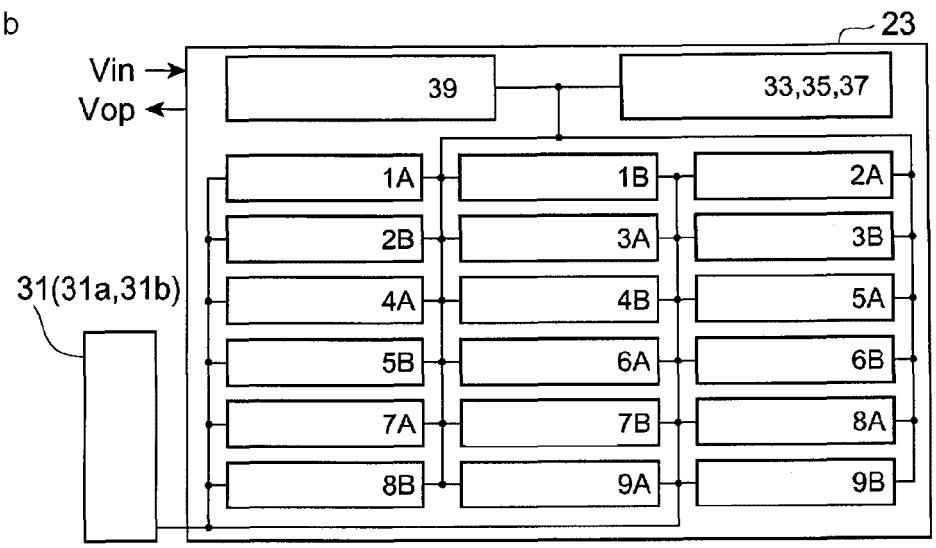

Part (a) of FIG. 11 is a drawing schematically showing a circuit of the cyclic A/D converter according to the present embodiment. In this embodiment, the gain in the cyclic A/D conversion process is less than two, which is represented by "2−a." Symbol "a" is a positive number of less than one. The use of the gain of less than two eliminates the need for use of three-valued digital redundant codes and thus enables reduction in circuit scale. The gain of less than two is substantialized by setting n=1 and m=8 in the circuit shown in FIG. 11, to obtain the gain (C1+C2+C3)/(C2+C3)=1+(m−n)/m=1.875 (a=0.125). With use of this capacitor ratio, G1=14 and G2=7 can be selectively used as gains over 1 in the process for noise cancellation. With reference to Part (a) of FIG. 11, the cyclic A/D converter 21b includes a correction circuit 70 for correcting N digital values of signal $S_{DIG}(B_0)$ from the sub A/D converter circuit 25 to generate digital values of (M+1) bits, where N=(M+1)×log(2)/log(1−a). For obtaining the digital values, the cyclic A/D converter performs N (N>M+1) cyclic operations for generation of the digital values of (M+1) bits. The sub A/D converter circuit (e.g., two comparators 25a and 25b) 25 operates in accordance with the operation timing of clock $\phi_C$. For example, when a=0.125 and M=14, it is necessary to perform cycles corresponding to N=16.54 bits, or 17 bits.

Since the gain of the gain stage 13 is less than two, the following equation holds.

[Mathematical Expression 1]

$$\frac{V_O}{V_R} = (2-a)\frac{V_{IN}}{V_R} - (1-a)D_0 \quad (1)$$

The true digital value corresponding to the analog input signal is denoted by "$X_0$." The digital value $X_0$ corresponds to a value obtained by digitizing $V_{IN}/V_R$ (where $V_R=V_{Ref}$).

[Mathematical Expression 2]

$$X_1 = (2-a)X_0 - (1-a)D_0 \quad (2)$$

The i-th output of the operational amplifier is denoted by Xi, the one-bit A/D conversion value is denoted by Di taking "+1" or "−1," and $X_2$ to $X_N$ are determined from Eq (2). By substituting these equations into the equation in order, we obtain the following equation.

[Mathematical Expression 3]

$$X_N = (2-a)^N X_0 - (1-a)\sum_{i=0}^{N-1}(2-a)^{N-1-i}D_i \quad (3)$$

The first term is the residual, which is sufficiently small. When this term is neglected, we obtain the following expression.

[Mathematical Expression 4]

$$X_0 \cong \frac{(1-a)}{(2-a)^N} \sum_{i=0}^{N-1} (2-a)^{N-1-i} D_i \quad (4)$$

The summation symbol indicates a product-sum operation. With definition of ui=(2−a)−1−i, the term of the summation mark can be written as follows.

[Mathematical Expression 5]

$$\sum_{i=0}^{N-1} u_i D_i \quad (5)$$

Accordingly, the correction circuit 70 includes a product-sum operation circuit, or a circuit executing an equivalent product-sum operation.

The correction in the correction circuit 70 is obtained by performing a process for an operation of a bit string (N bits) using the correction factor associated with the gain in the cyclic A/D conversion. The sub A/D converter circuit 25 includes a single comparator 25c for comparison of the operation value $V_{OP}$. The logic circuit 27 generates a control signal $S_{CONT}(\phi_{DN}, \phi_{DP})$ to control the D/A converter circuit 29 for cyclic A/D conversion, in response to the signal $S_{DIG}(B_0)$ from the sub A/D converter circuit 25. The D/A converter circuit 29 operates in accordance with the control signal $S_{CONT}$ to generate the D/A signal $S_{D/A}$ according to the result of the latest cyclic A/D conversion. In the present embodiment, the D/A signal $S_{D/A}$ generates either of the two values below, for example, in response to the control signal from the logic circuit 27.

(1) $S_{A/D}=V_{Ref}$ if the condition $(0 \geq V_{OP})$ is met;
(2) $S_{A/D}=-V_{Ref}$ if the condition $(V_{OP}>0)$ is met.

Part (b) of FIG. 11 shows the gain stage 23 that operates in accordance with the signals from the timing circuit. The process for noise cancellation is carried out by the circuit shown in Part (b) of FIG. 11, in the same manner as in the above embodiment. Switch means according to a necessary function(s) can be selected from the switch means 1A to 9B.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

INDUSTRIAL APPLICABILITY

As described above, the invention associated with the embodiments relates to the cyclic A/D conversion provided with the noise cancellation function having a gain. When the noise canceling circuits with amplification are used in columns of the CMOS image sensor, it is feasible to perform low-noise readout. By amplifying signals read from pixels, it is feasible to relatively decrease the amplitude of noise superimposed on the signal lines after the readout and to reduce influence of noise generated by the amplifier itself in the noise cancellation circuit and thermal noise generated by the amplifiers in the pixels of the CMOS image sensor. As a result, low-noise readout is provided. When the A/D converters are arranged to form an array in the columns of the image sensor to constitute an integrated circuit, and the A/D converters are operated in parallel, resulting in fast A/D conversion. Since no noise is superimposed after completion of conversion into digital signals, the present invention is effective in low-noise signal readout. Although the conventional circuit systems allow the integration of the amplification type noise canceller and the A/D converter both in a column, the circuit scale becomes large because the amplification type noise canceller and the A/D converter are composed of separate circuits.

In contrast to it, the embodiments of the present invention allow the execution of the process for noise cancellation with the gain and the process for cyclic A/D conversion using the common capacitors and operational amplifier, thereby realizing the circuit with a smaller die size. Furthermore, the low-noise image sensor is realized by the noise cancellation process with the gain.

Therefore, the present invention provides the cyclic A/D converter capable of effectively performing the amplification type noise cancellation process by the simple operation and also capable of achieving reduction of noise. The plural capacitors and the single operational amplifier circuit can be shared without waste, for the amplification type noise cancellation process and the cyclic A/D conversion process.

The invention claimed is:

1. A cyclic analog/digital converter for processing an input signal having a first signal level and a second signal level, the first signal level including a noise component, and the second signal level including a signal component superimposed on the noise component, comprising:
    a gain stage having first, second and third capacitors and an operational amplifier circuit, the gain stage performing a process for noise cancellation and amplification to generate a difference signal and a process for cyclic A/D conversion of the difference signal, and the difference signal indicating a difference between the first and second signal levels;
    a sub A/D converter circuit receiving a signal from an output of the operational amplifier circuit;
    a logic circuit connected to the sub A/D converter circuit;
    a D/A converter circuit operable in accordance with a control signal from the logic circuit; and
    a timing circuit for controlling operations of the process for noise cancellation and amplification and the process for cyclic A/D conversion of the gain stage,
    in the process for noise cancellation, the gain stage sampling either one of the first and second signal levels into each of the first and second capacitors, and, in response to reception of another of the first and second signal levels through the first and second capacitors at an input of the operational amplifier circuit to which the third capacitor is connected as a feedback capacitor, the gain stage generating the difference signal at an output of the operational amplifier circuit and storing the difference signal in each of the first and second capacitors, and
    in the process for cyclic A/D conversion, the gain stage receiving a signal from the D/A converter circuit through the first capacitor at the input of the operational amplifier circuit to which each of the second and third capacitors are connected as a feedback capacitor, to generate an operation value at the output of the operational amplifier circuit, and sampling the operation value into the first capacitor.

2. The cyclic analog/digital converter according to claim 1, wherein an amplification factor for the difference signal is defined by a ratio of a capacitance of the third capacitor and the sum of capacitances of the first and second capacitors.

3. The cyclic analog/digital converter according to claim 1, wherein in the process for noise cancellation, the first and second capacitors are connected in parallel to each other, and the third capacitor is connected between the input and the output of the operational amplifier circuit, wherein the gain stage resets the input and the output of the operational amplifier circuit and receives either one of the first and second signal levels to the first and second capacitors to store a sampled charge in each of the first and second capacitors, wherein the gain stage rearranges the sampled charge to the first to third capacitors in response to reception of another of the first and second signal levels through the first and second capacitors at the input of the operational amplifier circuit, to generate the difference signal at the output of the operational amplifier circuit, and wherein the gain stage samples the difference signal into the first and second capacitors to store a charge according to the difference signal in each of the first and second capacitors.

4. The cyclic analog/digital converter according to claim 1, wherein in the process for cyclic A/D conversion, the second and third capacitors are connected in parallel to each other, and the second and third capacitors are connected to the operational amplifier circuit, wherein in response to reception of a signal from the D/A converter circuit through the first capacitor at the input of the operational amplifier circuit, the gain stage transfers a charge on the first capacitor to the second and third capacitors for rearranging the charge, to generate the operation value at the output of the operational amplifier circuit, wherein the first capacitor receives the operation value to store a charge according to the operation value, and wherein the process for cyclic A/D conversion is repeatedly carried out a desired number of times such that the sub A/D converter circuit provides a bit string.

5. The cyclic analog/digital converter according to claim 1, wherein the gain stage has a fully differential configuration, wherein the gain stage further has fourth, fifth and sixth capacitors, wherein in the process for noise cancellation, the gain stage samples either one of the first and second signal levels into each of the fourth and fifth capacitors, and the gain stage generates the difference signal at the output of the operational amplifier circuit in response to reception of another of the first and second signal levels through the fourth and fifth capacitors at the input of the operational amplifier circuit to which the sixth capacitor is connected as a feedback capacitor, and samples the difference signal into each of the fourth and fifth capacitors, and wherein in the process for cyclic A/D conversion, the gain stage receives the signal from the D/A converter circuit through the fourth capacitor at the input of the operational amplifier circuit to which the fifth and sixth capacitors are connected as a feedback capacitor, to generate an operation value at the output of the operational amplifier circuit, and samples the operation value into the fourth capacitor.

6. The cyclic analog/digital converter according to claim 1, wherein the sub A/D converter circuit compares a signal from the gain stage with predetermined two reference signals to generate a three-valued redundant digital signal.

7. The cyclic analog/digital converter according to claim 1, wherein a ratio (C2/C3) of the second capacitor and the third capacitor is indicated by m−1, where the m is a number of not less than two, and wherein a ratio (C1/C3) of the first capacitor and the third capacitor is indicated by the m.

8. The cyclic analog/digital converter according to claim 1, wherein a gain of the cyclic A/D conversion in the gain stage is equal to two.

9. The cyclic analog/digital converter according to claim 1, wherein a gain of the cyclic A/D conversion in the gain stage is less than two, wherein the cyclic analog/digital converter further comprising a correction circuit, the correction circuit being provided for correcting digital values from the sub A/D converter circuit through N cyclic A/D conversion operations, using a correction factor associated with the gain, to generate digital values of M+1 (N>M+1) bits.

10. The cyclic analog/digital converter according to claim 1, wherein the sub A/D converter circuit includes a comparator for comparing a signal from the gain stage with a predetermined reference signal.

11. A cyclic analog/digital converter for processing an input signal having a first signal level and a second signal level, the first signal level including a noise component, and the second signal level including a signal component superimposed on the noise component, comprising:

a gain stage including an operational amplifier circuit and first, second and third capacitors, the gain stage being capable of executing a process for noise cancellation to generate a difference signal indicating a difference between the first and second signal levels, and performing a process for cyclic A/D conversion of the difference signal;

a sub A/D converter circuit receiving a signal from an output of the operational amplifier circuit;

a logic circuit connected to the sub A/D converter circuit;

a D/A converter circuit operable in accordance with a control signal from the logic circuit; and a timing circuit for controlling operations of the process for noise cancellation and the process for cyclic A/D conversion in the gain stage, in the process for noise cancellation, the gain stage sampling either one of the first and second signal levels into a first sampling capacitor, and, in response to reception of another of the first and second signal levels through the first sampling capacitor at an input of the operational amplifier circuit to which a first feedback capacitor is connected, the gain stage generating the difference signal at an output of the operational amplifier circuit and storing the difference signal in the first sampling capacitor and the first feedback capacitor, in the process for cyclic A/D conversion, the gain stage receiving a signal from the D/A converter circuit through a second sampling capacitor at the input of the operational amplifier circuit to which a second feedback capacitor is connected, to generate an operation value at the output of the operational amplifier circuit, and storing the operation value in the second sampling capacitor, the process for noise cancellation including first and second process modes which are exclusively executable, the timing circuit selecting an operation in the first and second process modes of the gain stage and controlling the operation of the selected process mode, a first gain of the gain stage in the first process mode being defined by a ratio of a capacitance of the third capacitor and the sum of capacitances of the first and second capacitors, a second gain of the gain stage in the second process mode being defined by a ratio of the capacitance of the third capacitor and the capacitance of the first capacitor, and the gain stage comprising:

first switch means for providing a connection of the first capacitor such that the second sampling capacitor is composed of the first capacitor and for providing a connection of the second and third capacitors such that the second feedback capacitor is composed of the second and third capacitors;

second switch means for providing a connection of the first and second capacitors such that the first sampling capacitor is composed of the first and second capacitors and for providing a connection of the third capacitor such that the first feedback capacitor is composed of the third capacitor; and third switch means for providing a connection of the first capacitor such that the first sampling capacitor is composed of the first capacitor and providing a connection of the third capacitor such that the first feedback capacitor is composed of the third capacitor, and for providing a parallel connection of the second capacitor to the first sampling capacitor for sampling of the difference signal.

12. The cyclic analog/digital converter according to claim 11, wherein the process for noise cancellation includes a third process mode which is exclusively executable from the first and second process modes, wherein a third gain of the gain stage in the third process mode is defined by a ratio of the sum of capacitances of the second and third capacitors and a capacitance of the first capacitor, wherein the timing circuit selects an operation in the third process mode in addition to the first and second process modes of the gain stage, and wherein the gain stage further comprises fourth switch means for providing a connection of the first capacitor such that the first sampling capacitor is composed of the first capacitor and for providing a connection of the second and third capacitors such that the first feedback capacitor is composed of the second and third capacitors.

13. The cyclic analog/digital converter according to claim 11, wherein the sub A/D converter circuit compares a signal from the gain stage with predetermined two reference signals to generate a three-valued redundant digital signal.

14. The cyclic analog/digital converter according to claim 11, wherein a ratio (C2/C3) of the second capacitor and the third capacitor is indicated by m−1, where the m is a number of not less than two, and wherein a ratio (C1/C3) of the first capacitor and the third capacitor is indicated by the m.

15. The cyclic analog/digital converter according to claim 11, wherein a gain of the cyclic A/D conversion in the gain stage is equal to two.

16. The cyclic analog/digital converter according to claim 11, wherein a gain of the cyclic A/D conversion in the gain stage is less than two, wherein the cyclic analog/digital converter further comprising a correction circuit, the correction circuit being provided for correcting digital values from the sub A/D converter circuit through N cyclic A/D conversion operations, using a correction factor associated with the gain, to generate digital values of M+1 (N>M+1) bits.

17. A cyclic analog/digital converter for processing an input signal having a first signal level and a second signal level, the first signal level including a noise component, and the second signal level including a signal component superimposed on the noise component, comprising:

a gain stage including an operational amplifier circuit and first, second and third capacitors, the gain stage being capable of executing a process for noise cancellation for generating a difference signal, and performing a process for cyclic A/D conversion of the difference signal, the difference signal indicating a difference between the first and second signal levels;

a sub A/D converter circuit receiving a signal from an output of the operational amplifier circuit;

a logic circuit connected to the sub A/D converter circuit;

a D/A converter circuit operable in accordance with a control signal from the logic circuit; and a timing circuit for controlling operations of the process for noise cancellation and the process for cyclic A/D conversion of the gain stage, in the process for noise cancellation, the gain stage sampling either one of the first and second signal levels into a first sampling capacitor, and, in response to reception of another of the first and second signal levels through the first sampling capacitor at an input of the operational amplifier circuit to which a first feedback capacitor is connected, the gain stage generating the difference signal at an output of the operational amplifier circuit and storing the difference signal in the first sampling capacitor and the first feedback capacitor, in the process for cyclic A/D conversion, the gain stage receiving a signal from the D/A converter circuit through a second sampling capacitor at the input of the operational amplifier circuit to which a second feedback capacitor is connected, to generate an operation value at the output of the operational amplifier circuit, and storing the operation value in the second sampling capacitor, the process for noise cancellation including first and third process modes which are exclusively executable, the timing circuit selecting an operation in the first and third process modes of the gain stage and controlling the selected operation of the process for noise cancellation, a first gain of the gain stage in the first process mode being defined by a ratio of a capacitance of the third capacitor and the sum of capacitances of the first and second capacitors, a third gain of the gain stage in the third process mode being defined by a ratio of the sum of the capacitances of the second and third capacitors and the capacitance of the first capacitor, and the gain stage comprising:

first switch means for providing a connection of the first capacitor such that the second sampling capacitor is composed of the first capacitor and for providing a connection of the second and third capacitors such that the first feedback capacitor is composed of the second and third capacitors;

second switch means for providing a connection of the first and second capacitors such that the first sampling capacitor is composed of the first and second capacitors and for providing a connection of the third capacitor such that the first feedback capacitor is composed of the third capacitor; and fourth switch means for providing a connection of the first capacitor such that the first sampling capacitor is composed of the first capacitor and for providing a connection of the second and third capacitors such that the first feedback capacitor is composed of the second and third capacitors.

18. The cyclic analog/digital converter according to claim 17, wherein the sub A/D converter circuit compares a signal from the gain stage with predetermined two reference signals to generate a three-valued redundant digital signal.

19. The cyclic analog/digital converter according to claim 17, wherein a ratio (C2/C3) of the second capacitor and the third capacitor is indicated by m−1, where the m is a number of not less than two, and wherein a ratio (C1/C3) of the first capacitor and the third capacitor is indicated by the m.

20. The cyclic analog/digital converter according to claim 17, wherein a gain of the cyclic A/D conversion in the gain stage is equal to two.

21. The cyclic analog/digital converter according to claim 17, wherein a gain of the cyclic A/D conversion in the gain stage is less than two, wherein the cyclic analog/digital converter further comprising a correction circuit, the correction circuit being provided for correcting digital values from the sub A/D converter circuit through N cyclic A/D conversion operations, using a correction factor associated with the gain, to generate digital values of M+1 (N>M+1) bits.

* * * * *